(12) United States Patent
Numata et al.

(10) Patent No.: US 7,936,114 B2
(45) Date of Patent: May 3, 2011

(54) PIEZOELECTRIC VIBRATOR MANUFACTURING METHOD, PIEZOELECTRIC VIBRATOR, OSCILLATOR, ELECTRONIC DEVICE, AND RADIO-CONTROLLED WATCH

(75) Inventors: Masashi Numata, Chiba (JP); Kiyoshi Aratake, Chiba (JP); Kazuyoshi Sugama, Chiba (JP); Sumihiko Kurita, Takeo (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 12/853,659

(22) Filed: Aug. 10, 2010

(65) Prior Publication Data

US 2010/0320872 A1    Dec. 23, 2010

Related U.S. Application Data

(63) Continuation of application No. PCT/JP2008/069851, filed on Oct. 31, 2008.

(30) Foreign Application Priority Data

Feb. 18, 2008  (JP) ................... 2008-036421
Jun. 24, 2008  (JP) ................... 2008-164663

(51) Int. Cl.
  *H01L 41/047*    (2006.01)
  *H01L 41/053*    (2006.01)
(52) U.S. Cl. ..................... 310/348; 310/365
(58) Field of Classification Search ............ 310/348, 310/365, 366
See application file for complete search history.

(56) References Cited

U.S. PATENT DOCUMENTS

| | | | |
|---|---|---|---|
| 2002/0135275 A1* | 9/2002 | Heinz et al. | 310/366 |
| 2005/0162484 A1* | 7/2005 | Isono | 347/68 |
| 2005/0248628 A1* | 11/2005 | Isono | 347/71 |
| 2005/0253488 A1* | 11/2005 | Ito | 310/366 |
| 2006/0082618 A1* | 4/2006 | Ito | 347/68 |
| 2007/0206341 A1* | 9/2007 | Florain et al. | 361/311 |

(Continued)

FOREIGN PATENT DOCUMENTS

JP    07-118616 A    5/1995

(Continued)

OTHER PUBLICATIONS

International Search Report for International Application No. PCT/JP2008/069851, dated Jan. 13, 2009, 2 pages.

*Primary Examiner* — Thomas M Dougherty
(74) *Attorney, Agent, or Firm* — Brinks Hoffer Gilson & Lione

(57) ABSTRACT

The piezoelectric vibrator of the invention comprises a base substrate, a lid substrate in which cavity recesses are formed and which is bonded to the base substrate in such a state that the recesses face the base substrate, a piezoelectric vibration member bonded to the upper face of the base substrate in such a state that it is housed in the cavity formed of the recess between the base substrate and the lid substrate, an external electrode formed on the lower face of the base substrate, a through-electrode formed in and through the base substrate and electrically connected with the external electrode with keeping the airtightness inside the cavity, and a routing electrode formed on the upper face of the base substrate to electrically connect the through-electrode to the bonded piezoelectric vibration member; wherein the through-electrode is formed through hardening of a paste containing a plurality of metal fine particles and a plurality of glass beads.

4 Claims, 20 Drawing Sheets

U.S. PATENT DOCUMENTS

| | | | |
|---|---|---|---|
| 2009/0193636 A1* | 8/2009 | Florian et al. | 29/25.35 |
| 2009/0195125 A1* | 8/2009 | Matsugi | 310/348 |
| 2010/0181872 A1* | 7/2010 | Sugama et al. | 310/344 |
| 2010/0207697 A1* | 8/2010 | Sayama | 331/158 |
| 2010/0207698 A1* | 8/2010 | Tange | 331/158 |
| 2010/0308928 A1* | 12/2010 | Aratake et al. | 331/116 R |

FOREIGN PATENT DOCUMENTS

| | | |
|---|---|---|
| JP | 08-316644 A | 11/1996 |
| JP | 2001-267190 A | 9/2001 |
| JP | 2001-345555 A | 12/2001 |
| JP | 2002-124845 A | 4/2002 |
| JP | 2006-279872 A | 10/2006 |
| JP | 2006-331788 A | 12/2006 |
| JP | 2007-267101 A | 10/2007 |
| JP | 2007-269959 A | 10/2007 |
| JP | 2007-328941 A | 12/2007 |
| JP | 2010-171536 A * | 8/2010 |

* cited by examiner

PIEZOELECTRIC VIBRATOR MANUFACTURING METHOD, PIEZOELECTRIC VIBRATOR, OSCILLATOR, ELECTRONIC DEVICE, AND RADIO-CONTROLLED WATCH

RELATED APPLICATIONS

This application is a continuation of PCT/JP2008/069851 filed on Oct. 31, 2008, which claims priority to Japanese Application Nos. 2008-036421 filed on Feb. 18, 2008 and 2008-164663 filed on Jun. 24, 2008. The entire contents of these applications are incorporated herein by reference.

TECHNICAL FIELD

The present invention relates to a surface mount device-type (SMD) piezoelectric vibrator in which a piezoelectric vibration member is sealed up in a cavity formed between two bonded substrates, to a piezoelectric vibrator manufacturing method for manufacturing the piezoelectric vibrator, and to an oscillator, an electronic device and a radio-controlled watch having the piezoelectric vibrator.

BACKGROUND OF THE INVENTION

In recent years, mobile telephones and portable information terminals employ a piezoelectric vibrator using quartz crystal or the like as a time source, a timing source of control signals or the like, a reference signal source, etc. As this type of piezoelectric vibrator, various ones are offered. As one of them, a surface mount device-type piezoelectric vibrator is known. As the piezoelectric vibrator of the type, generally known is a three-layer structure type one in which a piezoelectric substrate with a piezoelectric vibration member formed thereon is sandwiched between a base substrate and a lid substrate and bonded all together. In this case, the piezoelectric vibrator is housed in the cavity (sealed unit) formed between the base substrate and the lid substrate. Recently, not only the above-mentioned three-layer structure type one but also a two-layer structure type one has been developed.

The piezoelectric vibrator of the type has a two-layer structure in which the base substrate and the lid substrate are directly bonded to each other; and a piezoelectric vibration member is housed in the cavity formed between the two substrates. As compared with a three-layer structure one, the two-layer structure type piezoelectric vibrator is excellent in that it can be thinned, and is therefore favorably used. As one of such two-layer structure type piezoelectric vibrators, a piezoelectric vibrator is known, in which the piezoelectric vibration member is electrically connected to the external electrode formed on the base substrate using the electroconductive member formed to run through the base substrate (see Patent Reference 1 to Patent Reference 4).

The piezoelectric vibrator 300 comprises, as shown in FIG. 30 and FIG. 31, a base substrate 301 and a lid substrate 302 anodically-bonded to each other via a bonding film 307, and a piezoelectric vibration member 303 sealed up in the cavity C formed between the two substrates 301 and 302. The piezoelectric vibration member 303 is, for example, a tuning fork-type vibration member, and this is mounted on the upper face of the base substrate 301 via an electroconductive adhesive E in the cavity C.

The base substrate 301 and the lid substrate 302 are, for example, insulating substrates of ceramics, glass or the like. Of the two substrates 301 and 302, the base substrate 301 has through-holes 304 running through the substrate 301. The through-hole 304 is filled with an electroconductive member 305 to seal up the through-hole 304. The electroconductive member 305 is electrically connected to the outer electrode 306 formed on the lower face of the base substrate 301, and is electrically connected to the piezoelectric vibration member 303 mounted in the cavity C.

Patent Reference 1: JP-A 2001-267190
Patent Reference 2: JP-A 2007-328941
Patent Reference 3: JP-A 2002-124845
Patent Reference 4: JP-A 2006-279872

In the above-mentioned, two-layer structure type piezoelectric vibrator, the electroconductive member 305 plays important two roles of blocking the through-hole 304 to thereby airtightly seal up the cavity C, and electrically connecting the piezoelectric vibration member 303 to the external electrode 306. In particular, in case where the adhesion to the through-hole 304 is insufficient, then the airtight sealing inside the cavity C may be lost; and in case where the contact with the electroconductive adhesive E or the external electrode 306 is insufficient, then the piezoelectric vibration member 303 may work erroneously. Accordingly, for evading such failures, the electroconductive member 305 must be formed in such a state that it completely blocks the through-hole 304 while kept in firm contact with the inner face of the through-hole 304 and it has no depression on the surface thereof.

However, Patent Reference 1 to Patent Reference 4 describe formation of the electroconductive member 305 with an electroconductive paste (Ag paste, Au—Sn paste, etc.), but have no description relating to a concrete manufacturing method of how to practically form it.

In general, in case where an electroconductive paste is used, it must be fired and hardened. In other words, after the through-hole 304 is filled with an electroconductive paste, it must be fired and hardened. When fired, however, the organic matter in the electroconductive paste may be lost through evaporation; and therefore, in general, the volume after firing decreases as compared with that before firing (for example, in case where an Ag paste is used as the electroconductive paste, the volume may decrease by about 20% or so). Accordingly, even when the electroconductive member 305 is formed with an electroconductive paste, the surface may have depressions formed thereon or, in some serious cases, there may be a risk of forming through-holes in the center.

As a result, the cavity C may lose its airtightness, or there is a possibility that the electric connection between the piezoelectric vibration member 303 and the external electrode 306 may be lost.

SUMMARY OF THE INVENTION

The present invention has been made in consideration of the situation as above, and its object is to provide a high-quality two-layer structure-type, surface-mount piezoelectric vibrator that surely maintains the airtightness inside the cavity and secures stable electric connection between the piezoelectric vibration member and the external electrode, a piezoelectric vibrator manufacturing method, and an oscillator, an electronic device and a radio-controlled watch comprising a piezoelectric vibrator.

To solve the above-mentioned problems, the invention provides the following means:

The piezoelectric vibrator of the invention comprises a base substrate, a lid substrate in which cavity recesses are formed and which is bonded to the base substrate in such a state that the recesses face the base substrate, a piezoelectric vibration member bonded to the upper face of the base substrate in such a state that it is housed in the cavity formed of the recess between the base substrate and the lid substrate, an external electrode formed on the lower face of the base substrate, a through-electrode formed in and through the base substrate and electrically connected with the external electrode with keeping the airtightness inside the cavity, and a routing electrode formed on the upper face of the base substrate to electrically connect the through-electrode to the bonded piezoelectric vibration member, wherein the through-electrode is formed through hardening of a paste material containing a plurality of metal fine particles and a plurality of glass beads.

Or again, the piezoelectric vibrator of the invention comprises a base substrate, a lid substrate in which cavity recesses are formed and which is bonded to the base substrate in such a state that the recesses face the base substrate, a piezoelectric vibration member bonded to the upper face of the base substrate in such a state that it is housed in the cavity formed of the recess between the base substrate and the lid substrate, an external electrode formed on the lower face of the base substrate, a through-electrode formed in and through the base substrate and electrically connected with the external electrode with keeping the airtightness inside the cavity, and a routing electrode formed on the upper face of the base substrate to electrically connect the through-electrode to the bonded piezoelectric vibration member, wherein the through-electrode is formed through hardening of a glass frit containing a plurality of metal fine particles and a plurality of glass beads.

The piezoelectric vibrator manufacturing method of the invention is a method for manufacturing a plurality of piezoelectric vibrators in which a piezoelectric vibration member is sealed up in a cavity formed between a base substrate and a lid substrate bonded to each other, all at once by utilizing a base substrate wafer and a lid substrate wafer, and the method comprises a recess forming step of forming, in the lid substrate wafer, a plurality of cavity recesses for forming cavities when the two wafers are overlaid, a through-electrode forming step of forming a plurality of through-electrodes in and through the base substrate wafer, using a paste material containing a plurality of metal fine particles and a plurality of glass beads, a routing electrode forming step of forming a plurality of routing electrodes connected electrically with the through-electrodes, on the upper face of the base substrate wafer, a mounting step of bonding the plural piezoelectric vibration members to the upper face of the base substrate wafer via the routing electrodes, an overlaying step of overlaying the base substrate wafer and the lid substrate wafer thereby to house the piezoelectric vibration members in the cavities surrounded by the recesses and the two wafers, a bonding step of bonding the base substrate wafer and the lid substrate wafer thereby to seal up the piezoelectric vibration members in the cavities, an external electrode forming step of forming a plurality of external electrodes connected electrically with the through-electrodes, on the lower face of the base substrate wafer, and a cutting step of cutting the two bonded wafers thereby to shred them into the plural piezoelectric vibrators, wherein the through-electrode forming step includes a through-hole forming step of forming a plurality of through-holes in and through the base substrate wafer, a filling step of implanting the paste material into the plural through-holes and blocking up the through-holes, and a firing step of firing the implanted paste material at a predetermined temperature to harden it.

Or again, the piezoelectric vibrator manufacturing method of the invention is a method for manufacturing a plurality of piezoelectric vibrators in which a piezoelectric vibration member is sealed up in a cavity formed between a base substrate and a lid substrate bonded to each other, all at once by utilizing a base substrate wafer and a lid substrate wafer, and the method comprises a recess forming step of forming, in the lid substrate wafer, a plurality of cavity recesses for forming cavities when the two wafers are overlaid, a through-electrode forming step of forming a plurality of through-electrodes in and through the base substrate wafer, using a glass frit containing a plurality of metal fine particles and a plurality of glass beads, a routing electrode forming step of forming a plurality of routing electrodes connected electrically with the through-electrodes, on the upper face of the base substrate wafer, a mounting step of bonding the plural piezoelectric vibration members to the upper face of the base substrate wafer via the routing electrodes, an overlaying step of overlaying the base substrate wafer and the lid substrate wafer thereby to house the piezoelectric vibration members in the cavities surrounded by the recesses and the two wafers, a bonding step of bonding the base substrate wafer and the lid substrate wafer thereby to seal up the piezoelectric vibration members in the cavities, an external electrode forming step of forming a plurality of external electrodes connected electrically with the through-electrodes, on the lower face of the base substrate wafer, and a cutting step of cutting the two bonded wafers thereby to shred them into the plural piezoelectric vibrators, wherein the through-electrode forming step includes a through-hole forming step of forming a plurality of through-holes in and through the base substrate wafer, a filling step of implanting the glass frit into the plural through-holes and blocking up the through-holes, and a firing step of firing the implanted glass frit at a predetermined temperature to harden it.

In the piezoelectric vibrator and the piezoelectric vibrator manufacturing method of the invention, first attained is the recess forming step for forming a plurality of cavity recesses in the lid substrate wafer. The recesses are those to be cavities when the two wafers are overlaid later.

At the same time or in a timing of before or after the step, a through-electrode forming step is attained for forming a plurality of through-electrodes in the base substrate wafer, using a paste material or a glass frit containing a plurality of metal fine particles and a plurality of glass beads. In this stage, plural through-electrodes are formed so as to be housed in the cavities formed in the lid substrate wafer when the two wafers are overlaid later.

The through-electrode forming step is described in detail. First, a through-hole forming step is attained for forming a plurality of through-holes in and through the base substrate wafer. Subsequently, a filling step is attained for implanting the paste material or the glass frit into the plural through-holes to thereby block up these through-holes. Subsequently, the firing step is attained for firing the filled paste or glass frit at a predetermined temperature to harden it. Accordingly, the paste material or the glass frit is kept firmly fixed to the inner face of the through-hole.

The paste material or the glass frit contains an organic matter, and when fired, the organic matter may evaporate away. Accordingly, when the paste material or the glass frit is fired, then its volume decreases as compared with the volume thereof before firing. Therefore, in a case where a mere paste material or glass frit not containing glass beads is implanted into the through-hole and then fired, the surface of the paste material or the glass frit may have great depressions.

However, in the invention, the paste material or glass frit containing a plurality of glass beads is used. Accordingly, after the filling step, plural glass beads are kept implanted in the through-hole along with the paste material or the glass frit therein. Therefore, as compared with a case where the through-hole is filled up with a paste material or a glass frit alone, the amount of the paste material or the glass frit may be reduced by the amount of the glass beads. In other words, the amount of the paste material or the glass frit to be used may be decreased. Accordingly, even when the organic matter in the paste material or the glass frit evaporates away in the firing step, the influence of the reduction in the volume of the paste material or the glass frit is small since the amount of the paste material or the glass frit itself is much smaller than before. Therefore, the surface depressions that may appear after hardening of the paste material and the glass frit are small and are on an ignorable level. Accordingly, the surface of the base substrate wafer and the surface of the hardened paste material or glass frit can be substantially in a flat face condition.

After the firing step, the through-electrode forming step is finished. Since the plural metal fine particles in the paste material or the glass frit are kept in contact with each other, the electroconductivity of the through-electrode is secured.

Next, a routing electrode forming step is attained for forming a plurality of routing electrodes connected electrically with the through-electrodes by patterning an electroconductive material on the upper face of the base substrate wafer. In this stage, the routing electrode is so formed that it can be housed in the recess formed in the lid substrate wafer when the two wafers are overlaid later.

In particular, as mentioned above, the through-electrode is substantially in a flat condition relative to the upper face of the base substrate wafer. Therefore, the routing electrode as patterned on the upper face of the base substrate wafer can be kept in airtight contact with the through-electrode with no space therebetween. Accordingly, the electric connection between the routing electrode and the through-electrode can be secured.

Next, a mounting step is attained for bonding a plurality of piezoelectric vibration members to the upper face of the base substrate wafer each via the routing electrode. Accordingly, the bonded piezoelectric vibration members are electrically connected to the through-electrodes via the routing electrodes. After the mounting operation, an overlaying step is attained for overlaying the base substrate wafer and the lid substrate wafer. Accordingly, the bonded plural piezoelectric vibration members are kept housed in the cavities surrounded by the recesses and the two wafers.

Next, a bonding step is attained for bonding the overlaid two wafers to each other. Accordingly, the two wafers adhere firmly to each other and therefore the piezoelectric vibration members can be sealed up in the cavities. In this stage, the through-holes formed in the base substrate wafer are blocked up with the through-electrodes, and therefore the airtightness inside the cavities is not broken through the through-holes. In particular, the paste material or the glass frit to constitute the through-electrodes firmly adheres to the inner face of the through-hole, therefore surely securing the airtightness inside the cavities.

Next, an external electrode forming step is attained for forming a plurality of external electrodes electrically connected with the respective through-electrodes by patterning an electroconductive material on the lower face of the base substrate wafer.

Also in this case, the through-electrodes are kept substantially in a flat condition relative to the lower face of the base substrate wafer like in the formation of the routing electrodes, and therefore, the patterned external electrodes are kept in airtight contact with the through-electrodes with no space therebetween. Accordingly, the electric connection between the external electrode and the through-electrode can be secured. As a result of this step, the piezoelectric vibration members sealed up in the cavities can be activated as utilizing the external electrodes.

Finally, a cutting step is attained for cutting the base substrate wafer and the lid substrate wafer bonded to each other, to thereby shred them into a plurality of piezoelectric vibrators.

As a result, a plurality of two-layer structure-type surface-mount piezoelectric vibrators with piezoelectric vibration members sealed up in cavities formed between a base substrate and a lid substrate bonded to each other can be manufactured all at once.

In particular, since the through-electrodes can be formed substantially in a flat condition relative to the base substrate, the through-electrodes can be surely kept in airtight contact with the routing electrodes and the external electrodes. As a result, stable electric connection between the piezoelectric vibration members and the external electrodes can be secured, and the reliability of operation performance can be enhanced to attain high-quality devices. Moreover, since the airtightness inside the cavities is surely kept, the high quality of the devices is secured in this respect. In addition, since the through-electrodes can be formed according to a simple method of using a paste material or a glass frit, the process can be simplified.

In the piezoelectric vibrator of the invention mentioned above, the thermal expansion coefficient of the glass beads is substantially equal to that of the base substrate.

In the piezoelectric vibrator manufacturing method of the invention mentioned above, the thermal expansion coefficient of the glass beads used is substantially equal to that of the base substrate.

In the piezoelectric vibrator and the piezoelectric vibrator manufacturing method of the invention, the thermal expansion coefficient of the glass beads in the paste material or the glass frit is substantially equal to the coefficient of the base substrate wafer. Specifically, in the firing step, the expansion level of the glass beads in the paste material or the glass frit is substantially equal to that of the base substrate wafer. Accordingly, the base substrate wafer is prevented from cracking, and the quality of the piezoelectric vibrator can be thereby increased.

In the piezoelectric vibrator of the invention mentioned above, the glass beads are spherical.

In the piezoelectric vibrator manufacturing method of the invention mentioned above, spherical glass beads are used as the glass beads.

In the piezoelectric vibrator and the piezoelectric vibrator manufacturing method of the invention, the glass beads in the paste material or the glass frit are spherical. Accordingly, the glass beads are kept in contact with each other in a point contact state. Accordingly, the glass beads can be kept in contact with each other with forming a space between the glass beads. Therefore, even when the glass beads are filled in the through-hole to the possible uppermost limit, the space secured between the glass beads can be utilized and the paste material or the glass frit containing metal fine particles can be spread from one face side of the base substrate to the other face side thereof. Accordingly, the electric conductivity of the through-electrode as secured through contact of the electroconductive metal fine particles in the paste material or the glass frit is not retarded by the contact of the insulator glass beads with each other. With that, the electric conductivity of the through-electrode can be stably secured.

In the piezoelectric vibrator of the invention mentioned above, the base substrate and the lid substrate are anodically bonded to each other via the bonding film formed between the two substrates with surrounding the periphery of the recesses.

The piezoelectric vibrator manufacturing method of the invention mentioned above comprises, prior to the mounting step, a bonding film forming step of forming, on the upper face of the base substrate wafer, a bonding film to surround the periphery of the recesses when the base substrate wafer and the lid substrate wafer are overlaid, and in the bonding step, the two wafers may be anodically bonded via the bonding film.

In the piezoelectric vibrator and the piezoelectric vibrator manufacturing method of the invention, since the base substrate wafer and the lid substrate wafer can be anodically bonded to each other via the bonding film, the two wafers can be more tightly bonded to each other to increase the airtightness inside the cavities. Accordingly, the piezoelectric vibration members can be vibrated with a higher degree of accuracy, and the devices can have further higher quality.

In the piezoelectric vibrator of the invention mentioned above, the piezoelectric vibration members are bump-bonded with an electroconductive bump.

In the piezoelectric vibrator manufacturing method of the invention mentioned above, the piezoelectric vibration members are bump-bonded with an electroconductive bump in the mounting step.

In the piezoelectric vibrator and the piezoelectric vibrator manufacturing method of the invention, since the piezoelectric vibration members are bump-bonded, the piezoelectric vibration members can be spaced above from the upper face of the base substrate by the thickness of the bump. Accordingly, the required minimum vibration gap necessary for vibration of the piezoelectric vibration members can be naturally secured. Therefore, the reliability of the operation performance of the piezoelectric vibrators can be further enhanced.

In the piezoelectric vibrator of the invention mentioned above, the metal fine particles are non-spherical.

In the piezoelectric vibrator manufacturing method of the invention mentioned above, the paste material of the glass frit containing non-spherical metal fine particles is implanted in the filling step.

In the piezoelectric vibrator and the piezoelectric vibrator manufacturing method of the invention, the metal fine particles in the paste material or the glass frit are not spherical but are non-spherical, and for example, they are shaped like thin and long fibers or are shaped to have a star-like cross section; and therefore, when they are kept in contact with each other, they may be readily in a line contact but not in a point contact. Accordingly, the electric conductivity of the through-electrodes can be further increased.

In the piezoelectric vibrator manufacturing method of the invention, the paste or the glass frit is defoamed and then implanted in the through-holes in the filling step.

In the piezoelectric vibrator manufacturing method of the invention, since the paste or the glass frit is previously defoamed, the paste or the glass frit containing few bubbles can be implanted. Accordingly, in the firing step, the reduction in the volume of the paste material or the glass frit can be inhibited as much as possible. Therefore, after the firing step, the surface of the base substrate wafer and the surface of the hardened paste material or glass frit can be in a flatter condition.

Accordingly, more stable electric connection between the piezoelectric vibration member and the external electrode can be secured, and the quality of the devices can be further increased.

Or again, the piezoelectric vibrator of the invention comprises a base substrate, a lid substrate in which cavity recesses are formed and which is bonded to the base substrate in such a state that the recesses face the base substrate, a piezoelectric vibration member bonded to the upper face of the base substrate in such a state that it is housed in the cavity formed of the recess between the base substrate and the lid substrate, an external electrode formed on the lower face of the base substrate, a through-electrode formed in the through-electrode formed in the base substrate in such a state that it is electrically connected with the external electrode with keeping the airtightness inside the cavity, and a routing electrode formed on the upper face of the base substrate to electrically connect the piezoelectric vibration member and the through-electrode, wherein the through-electrode is composed of an electroconductive core part inserted into the through-hole and a cylindrical body formed by mixing a glass frit and a granular material having a higher hardness than that of the glass frit followed by filling the mixture into the space between the through-hole and the core part.

Or again, the piezoelectric vibrator of the invention comprises a base substrate, a lid substrate in which cavity recesses are formed and which is bonded to the base substrate in such a state that the recesses face the base substrate, a piezoelectric vibration member bonded to the upper face of the base substrate in such a state that it is housed in the cavity formed of the recess between the base substrate and the lid substrate, an external electrode formed on the lower face of the base substrate, a through-electrode formed in the through-hole formed in the base substrate in such a state that it is electrically connected with the external electrode with keeping the airtightness inside the cavity, and a routing electrode formed on the upper face of the base substrate to electrically connect the piezoelectric vibration member and the through-electrode, wherein the through-electrode is composed of an electroconductive core part inserted into the through-hole and a cylindrical body formed by mixing a paste material and a granular material having a higher hardness than that of the paste material followed by filling the mixture into the space between the through-hole and the core part.

Having the constitution, the core part is not an electroconductive paste but is a rod-like member, and therefore, its volume does not reduce in firing. Even when the core part, and the filler to constitute the cylindrical body, as prepared by mixing a glass frit or a paste material, and a granular material having a higher hardness than that of the glass frit or the paste material, are disposed in the through-hole, generation of bubbles in the glass frit or the paste material can be prevented, and the volume reduction can be inhibited. In addition, as the cylindrical body, not a glass frit or a paste material alone, but a mixture prepared by mixing a glass frit or a paste material and a granular material having a higher hardness than that of the glass frit or the paste material is employed, the hardness of the cylindrical body can be high and the cylindrical body is prevented from being over-polished. Accordingly, the through-electrode formed can secure high airtightness inside the through-hole. In other words, high-quality, two-layer structure-having surface-mount piezoelectric vibrators can be provided in which the airtightness inside the cavity is surely secured and the electric connection between the piezoelectric vibration member and the external electrode is stably secured.

In the piezoelectric vibrator of the invention, the granular material is glass beads.

In that manner, easily available glass beads may be mixed in the glass frit or the paste material to constitute the cylindrical body, and therefore, the filler can be prepared inexpensively and the cylindrical body can surely exhibit its function; and the through-electrode formed in the through-hole can secure airtightness therein.

In the piezoelectric vibrator of the invention, the hardness of the cylindrical body is substantially equal to the hardness of the base substrate.

Having the constitution, when the core part and the filler to constitute the cylindrical body, as prepared by mixing a glass frit and a paste material and a granular material having a higher hardness than that of the glass frit or the paste material are disposed in the through-hole and fired, and then the surface of the base material and the through-electrode is polished, the cylindrical body is prevented from being over-polished since the hardness of the cylindrical body is substantially equal to that of the base substrate. In other words, in forming later the routing electrode for electrically connecting the piezoelectric vibration member and the through-electrode on the upper face of the base substrate, the routing electrode can be formed with accuracy and wire disconnection or the like trouble can be prevented. Accordingly, high-quality, two-layer structure-having surface-mount piezoelectric vibrators can be provided in which the electric connection between the piezoelectric vibration member and the external electrode is stably secured.

Or again, the piezoelectric vibrator manufacturing method of the invention is a method for manufacturing piezoelectric vibrators in which a piezoelectric vibration member is sealed up in a cavity formed between a base substrate and a lid substrate bonded to each other, which comprises a step of inserting the core part of an electroconductive tack member having a tabular basis part and a core part, which is formed to extend from the basis part toward the direction perpendicular to the surface of the basis part to the length substantially equal to the thickness of the base substrate and is formed to have a flat end, into the through-hole of the base substrate to thereby make the basis part of the tack member kept in contact with the first face of the base substrate, a step of applying a filler to the second face of the base substrate to thereby fill the filler into the through-hole, a step of firing and hardening the filler, and a step of polishing the first face and the second face of the base substrate to make the core part exposed out, wherein the filler is prepared by mixing a pasty glass frit with a granular material having a hardness higher than that of the hardened glass frit.

Or again, the piezoelectric vibrator manufacturing method of the invention is a method for manufacturing piezoelectric vibrators in which a piezoelectric vibration member is sealed up in a cavity formed between a base substrate and a lid substrate bonded to each other, which comprises a step of inserting the core part of an electroconductive tack member having a tabular basis part and a core part, which is formed to extend from the basis part toward the direction perpendicular to the surface of the basis part to the length substantially equal to the thickness of the base substrate and is formed to have a flat end, into the through-hole of the base substrate to thereby make the basis part of the tack member kept in contact with the first face of the base substrate, a step of applying a filler to the second face of the base substrate to thereby fill the filler into the through-hole, a step of firing and hardening the filler, and a step of polishing the first face and the second face of the base substrate to make the core part exposed out, wherein the filler is prepared by mixing a paste material with a granular material having a hardness higher than that of the hardened paste material.

According to the piezoelectric vibrator manufacturing method of the invention, the filler can be fired at a predetermined temperature to form the cylindrical body, and the through-hole, the cylindrical body and the core part of the tack member can be integrally fixed to each other. In firing, the basis part is also fired together with them, and therefore the two ends of the cylindrical body and the core part can be all integrally fixed to each other while kept substantially in a flat condition relative to the surface of the base substrate wafer. In addition, since the filler is prepared by mixing a pasty glass frit or a paste material with a granular material having a higher hardness than that of the glass frit or the paste material, the hardness of the hardened filler can be near to the hardness of the base material. For example, when glass beads of the same material as that of the base substrate are employed as the granular material, then the hardness of the cylindrical body can be near to the hardness of the base substrate.

By cutting and polishing the basis part of the tack member and the first face of the base substrate on which the basis part is disposed, after firing, to thereby make the core part of the tack member exposed out, the basis part having played the role of positioning the filler (cylindrical body) and the core part can be removed and only the core part can be left inside the cylindrical body. Since the cylindrical body is so designed that its hardness is near to the hardness of the base material, the cylindrical body can be prevented from being over-polished in the polishing operation. As a result, the cylindrical body and the core part can be integrally fixed to each other in the through-electrode formed. In other words, high-quality, two-layer structure-having surface-mount piezoelectric vibrators can be manufactured in which the airtightness inside the cavity is secured and the electric connection between the piezoelectric vibration member and the external electrode is stably secured.

Or again, the piezoelectric vibrator manufacturing method of the invention is a method for manufacturing piezoelectric vibrators by utilizing a base substrate wafer and a lid substrate wafer, which comprises a recess forming step of forming, in the lid substrate wafer, cavity recesses for forming cavities when the two wafers are overlaid, a through-electrode forming step of forming through-electrodes in and through the base substrate wafer, using an electroconductive tack member having a tabular basis part and a core part, which is formed to extend from the basis part toward the direction perpendicular to the surface of the basis part to the length substantially equal to the thickness of the base substrate wafer and is formed to have a flat end, a routing electrode forming step of forming routing electrodes connected electrically with the through-electrodes, on the upper face of the base substrate wafer, a mounting step of bonding the piezoelectric vibration members to the upper face of the base substrate wafer via the routing electrodes, an overlaying step of overlaying the base substrate wafer and the lid substrate wafer thereby to house the piezoelectric vibration members in the cavities surrounded by the recesses and the two wafers, a bonding step of bonding the base substrate wafer and the lid substrate wafer thereby to seal up the piezoelectric vibration members in the cavities, an external electrode forming step of forming external electrodes connected electrically with the through-electrodes, on the lower face of the base substrate wafer, and a cutting step of cutting the two bonded wafers thereby to shred them into plural piezoelectric vibrators, wherein the through-electrode forming step includes a through-hole forming step of forming through-holes for disposing the through-electrodes therein, in the base substrate wafer, a through-electrode disposing step of disposing the tack member in the through-hole of the base substrate wafer and filling a filler as prepared by mixing a pasty glass frit and a granular material having a higher hardness than that of the glass frit, into the space between the through-hole and the core part of the tack member, a firing step of firing the filler at a predetermined temperature to form a cylindrical body and integrally fixing the through-hole, the cylindrical body and the core part of the tack member to each other, and a cutting/polishing step of cutting/polishing the basis part of the tack member and the upper face of the base substrate wafer on which the basis part is disposed, to thereby make the core part exposed out.

Or again, the piezoelectric vibrator manufacturing method of the invention is a method for manufacturing piezoelectric vibrators by utilizing a base substrate wafer and a lid substrate wafer, which comprises a recess forming step of forming, in the lid substrate wafer, cavity recesses for forming cavities when the two wafers are overlaid, a through-electrode forming step of forming through-electrodes in and through the base substrate wafer, using an electroconductive tack member having a tabular basis part and a core part, which is formed to extend from the basis part toward the direction perpendicular to the surface of the basis part to the length substantially equal to the thickness of the base substrate wafer and is formed to have a flat end, a routing electrode forming step of forming routing electrodes connected electrically with the through-electrodes, on the upper face of the base substrate wafer, a mounting step of bonding the piezoelectric vibration members to the upper face of the base substrate wafer via the routing electrodes, an overlaying step of overlaying the base substrate wafer and the lid substrate wafer thereby to house the piezoelectric vibration members in the cavities surrounded by the recesses and the two wafers, a bonding step of bonding the base substrate wafer and the lid substrate wafer thereby to seal up the piezoelectric vibration members in the cavities, an external electrode forming step of forming external electrodes connected electrically with the through-electrodes, on the lower face of the base substrate wafer, and a cutting step of cutting the two bonded wafers thereby to shred them into plural piezoelectric vibrators, wherein the through-electrode forming step includes a through-hole forming step of forming through-holes for disposing the through-electrodes therein, in the base substrate wafer, a through-electrode disposing step of disposing the tack member in the through-hole of the base substrate wafer and filling a filler as prepared by mixing a paste material and a granular material having a higher hardness than that of the paste material, into the space between the through-hole and the core part of the tack member, a firing step of firing the filler at a predetermined temperature to form a cylindrical body and integrally fixing the through-hole, the cylindrical body and the core part of the tack member to each other, and a cutting/polishing step of cutting/polishing the basis part of the tack member and the upper face of the base substrate wafer on which the basis part is disposed, to thereby make the core part exposed out.

The through-electrode forming step is described in detail. First, a through-hole forming step is attained for forming through-holes in which through-electrodes are disposed, in and through the base substrate wafer. Subsequently, a through-electrode disposing step is attained for disposing the tack member in the through-hole and filling a filler as prepared by mixing a pasty glass frit or a paste material and a granular material having a higher hardness than that of the pasty glass frit or the paste material, into the space between the through-hole and the core part of the tack member. In this stage, the core part is inserted into the through-hole until the basis part of the tack member is kept in contact with the base substrate wafer. Accordingly, the two ends of the core part can be substantially in a flat condition relative to the surface of the base substrate wafer.

In case where the core part not having a basis part is inserted into the through-hole, it may be difficult to position the core part so that the two ends of the core part are in a flat condition relative to the surface of the base substrate wafer. However, since the tack member having the core part formed on the basis part thereof is used, the two ends of the core part can be surely and readily kept in a flat condition relative to the surface of the base substrate wafer merely in a simple operation of disposing the basis part so as to be in contact with the base substrate wafer. Accordingly, the workability in the through-electrode disposing step can be enhanced.

Further, since the basis part is formed to be tabular, even when the base substrate wafer is put on a flat face such as a desk or the like after the through-electrode disposing step and before the subsequent firing step, it may be kept stable but is not shaky. In this point, the workability can be enhanced.

Subsequently, a firing step is attained for firing the filler at a predetermined temperature to form a cylindrical body, and integrally fixing the through-hole, the cylindrical body and the core part of the tack member. In firing, the basis part is also fired together with them, and therefore the two ends of the cylindrical body and the core part can be all integrally fixed to each other while kept substantially in a flat condition relative to the surface of the base substrate wafer. In addition, since the filler is prepared by mixing a pasty glass frit or a paste material and a granular material having a higher hardness than that of the glass frit or the paste material, the hardness of the fired filler can be near to the hardness of the base substrate wafer, and for example, by employing glass beads of the same material as that of the base substrate wafer for the granular material, the hardness of the cylindrical body can be near to the hardness of the base substrate wafer.

Subsequently, after the firing, a cutting/polishing step is attained for butting/polishing the basis part of the tack member and the upper face of the base substrate wafer on which the basis part is disposed, to thereby make the core part of the tack member exposed out. Accordingly, the basis part that has played a role of positioning the filler (cylindrical body) and the core part can be removed, and only the core part can be left inside the cylindrical body. In addition, since the hardness of the cylindrical body is so designed as to be near to the hardness of the base substrate wafer, the cylindrical body is prevented from being over-cut/over-polished in the cutting/polishing operation.

As a result, through-electrodes can be formed, in which the cylindrical body and the core part are integrally fixed to each other.

In case where the through-electrode is formed of a glass frit or a paste material and an electroconductive core part, or that is, glass beads are not filled thereinto, foams or depressions may be formed in the fired glass frit or paste material. In addition, a glass frit generally contains bismuth or the like, and therefore the fired glass frit is soft and its hardness may be lower than the hardness of the base substrate wafer. Accordingly, in the subsequent cutting/polishing step, the glass frit may be over-cut/over-polished, and its surface may have depressions.

However, as described in the above, to form the cylindrical body, a filler is used, which is prepared by mixing the glass frit or the paste material and a granular material having a higher hardness than that of the glass frit or the paste material, and therefore, there is no risk of forming any large depressions in the surface of the base substrate wafer after firing. The volume may decrease in some degree by firing, but it is not so remarkable as to form visible depressions, and it may be within an ignorable range.

Accordingly, as so mentioned above, the surface of the base substrate wafer and the two ends of the cylindrical body and the core part can be substantially in a flat condition. In other words, the surface of the base substrate wafer can be substantially in a flat condition relative to the surface of the through-electrodes.

As a result, high-quality, two-layer structure-having surface-mount piezoelectric vibrators can be provided in which the airtightness inside the cavity is surely secured and the electric connection between the piezoelectric vibration member and the external electrode is stably secured, by integrally fixing the through-electrode to the through-hole.

The oscillator of the invention comprises, as the oscillation member therein, the above-mentioned piezoelectric vibrator as electrically connected to the integrated circuit therein.

The electronic device of the invention comprises the above-mentioned piezoelectric vibrator as electrically connected to the timer part therein.

The radio-controlled watch of the invention comprises the above-mentioned piezoelectric vibrator as electrically connected to the filter part therein.

The oscillator, the electronic device and the radio-controlled watch of the invention comprise a high-quality piezoelectric vibrator in which the cavity is surely airtightly sealed up and of which the reliability of the operation performance is enhanced, and therefore the reliability of the operation performance thereof can be enhanced and the quality thereof can be thereby increased.

The piezoelectric vibrator of the invention is a high-quality two-layer structure-type, surface-mount piezoelectric vibrator in which the airtightness inside the cavity is secured and the stable electric connection between the piezoelectric vibration member and the external electrode is secured.

According to the piezoelectric vibrator manufacturing method of the invention, the above-mentioned piezoelectric vibrators can be efficiently manufactured all at once, and the cost thereof can be thereby reduced.

The oscillator, the electronic device and the radio-controlled watch of the invention comprise the above-mentioned piezoelectric vibrator, and similarly the operation reliability thereof can be enhanced and the quality thereof can be thereby increased.

In the piezoelectric vibrator of the invention, the core part and the filler, as prepared by mixing a glass frit or a paste material to constitute the cylindrical body, and a granular material having a higher hardness than that of the glass frit or the paste material, are disposed in the through-hole and then fired, and no foams are generated and the volume of the fired filler is not reduced. In addition, since the core part is not an electroconductive paste but a rod-like member, its volume does not decrease in firing. Accordingly, the through-electrode can be formed with securing the airtightness in the through-hole. In other words, high-quality, two-layer structure-having surface-mount piezoelectric vibrators can be provided in which the airtightness inside the cavity is surely secured and the electric connection between the piezoelectric vibration member and the external electrode is stably secured.

DETAILED DESCRIPTION OF THE PREFERRED EMBODIMENTS

First Embodiment

The first embodiment of the piezoelectric vibrator of the invention is described below with reference to FIG. 1 to FIG. 18.

Figure 3:
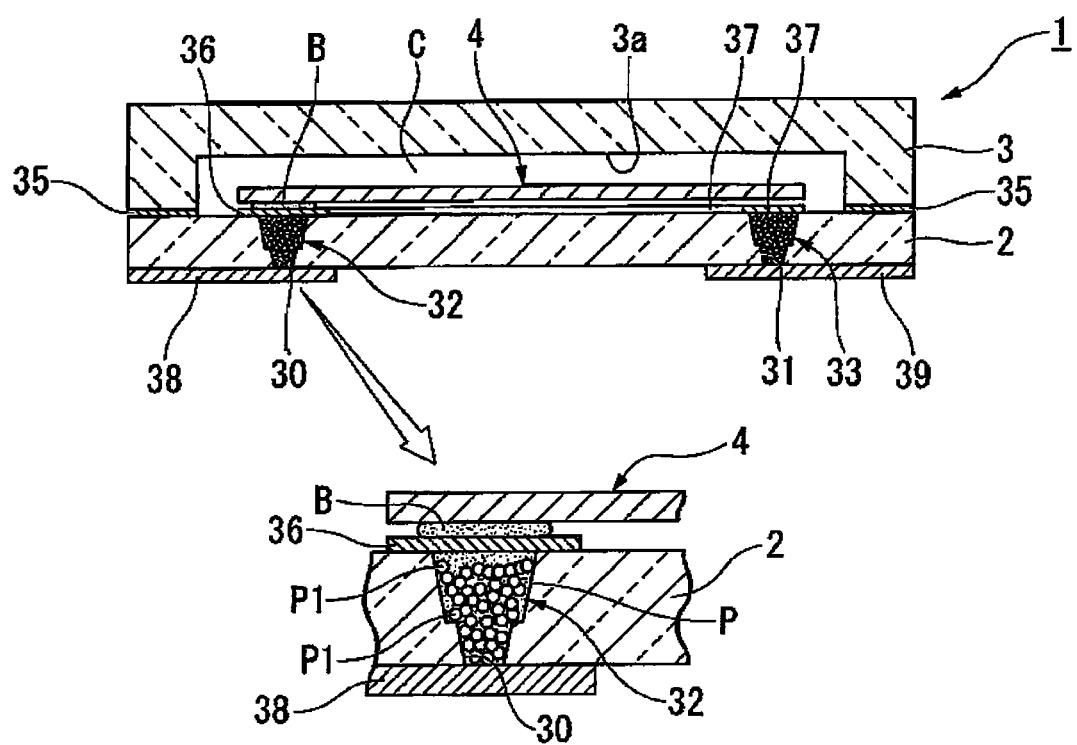
FIG. 3 is a cross-sectional view of the piezoelectric vibrator of the first embodiment of the invention (cross-sectional view cut along the line A-A in FIG. 2).
Figure 4:
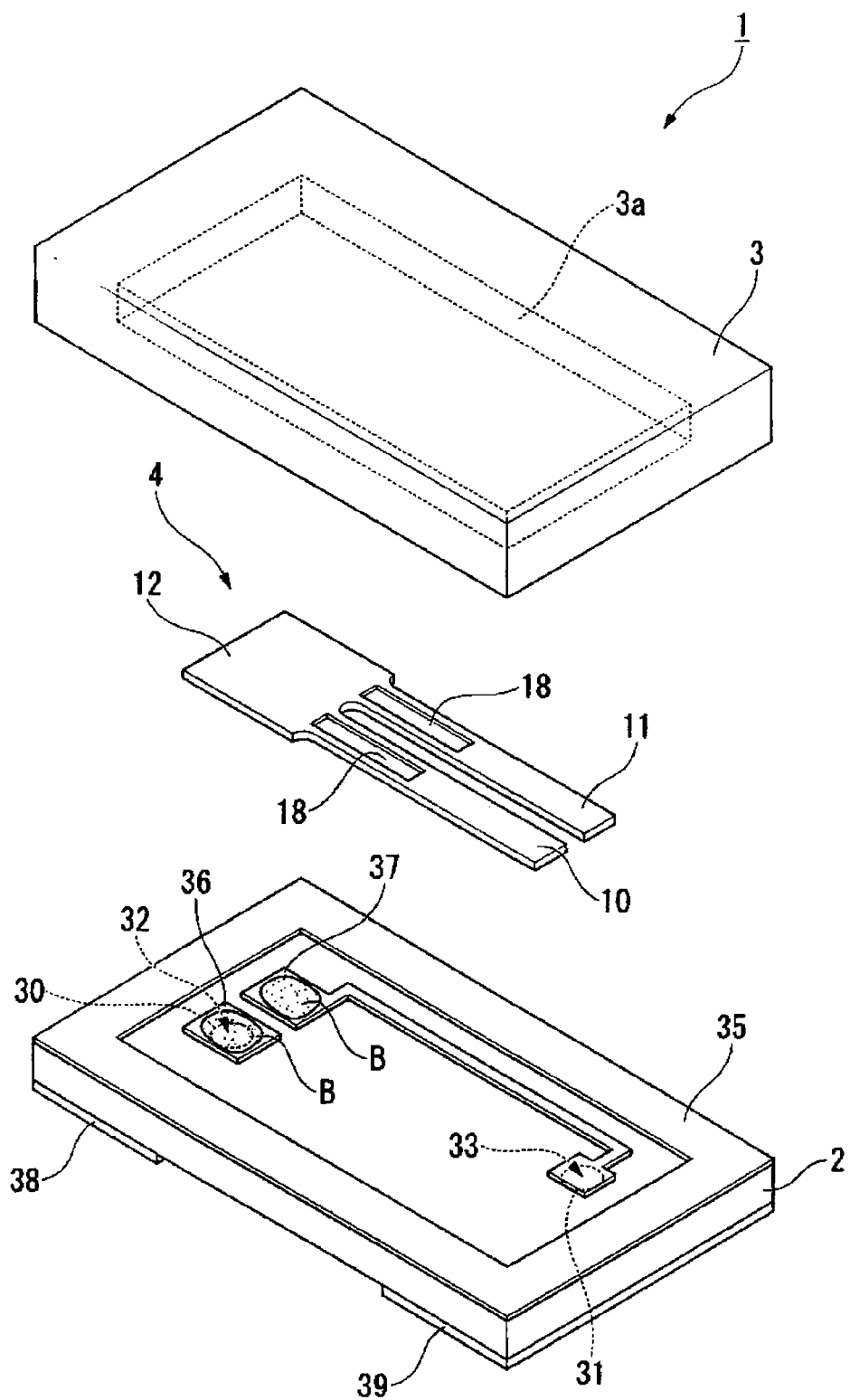
FIG. 4 is a perspective exploded view of the piezoelectric vibrator shown in FIG. 1.

The piezoelectric vibrator 1 of this embodiment is, as shown in FIG. 1 to FIG. 4, a surface-mount piezoelectric vibrator 1 that is formed to have a two-layer laminate boxy shape composed of a base substrate 2 and a lid substrate 3, in which a piezoelectric vibration member 4 is housed in the cavity C inside it. In FIG. 4, an excitation electrode 15, routing electrodes 19 and 20, mount electrodes 16 and 17, and a weight metal film 21 to be mentioned below are omitted for facilitating the understanding of the view.

Figure 5:
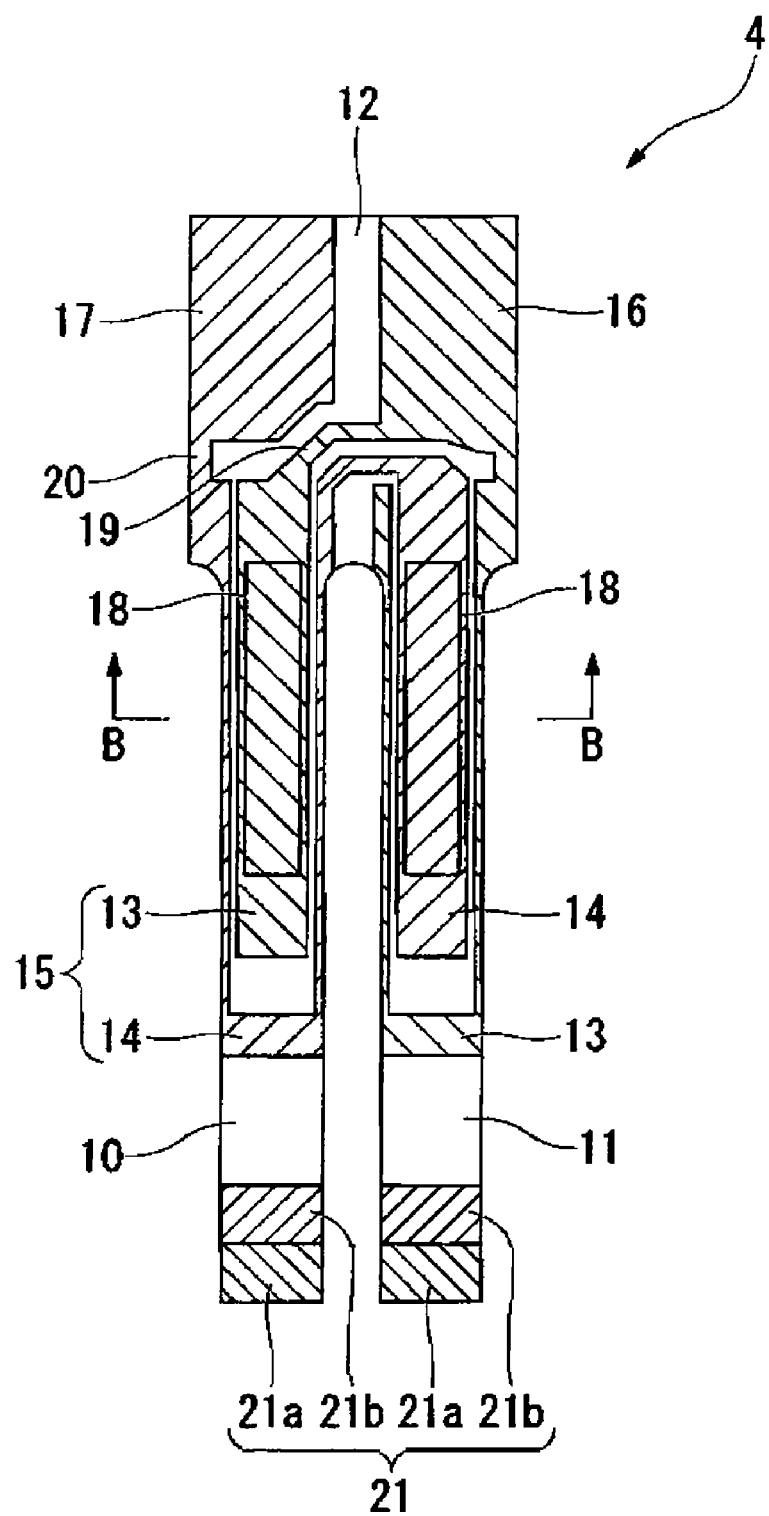
FIG. 5 is a top view of the piezoelectric vibration member constituting the piezoelectric vibrator shown in FIG. 1.
Figure 6:
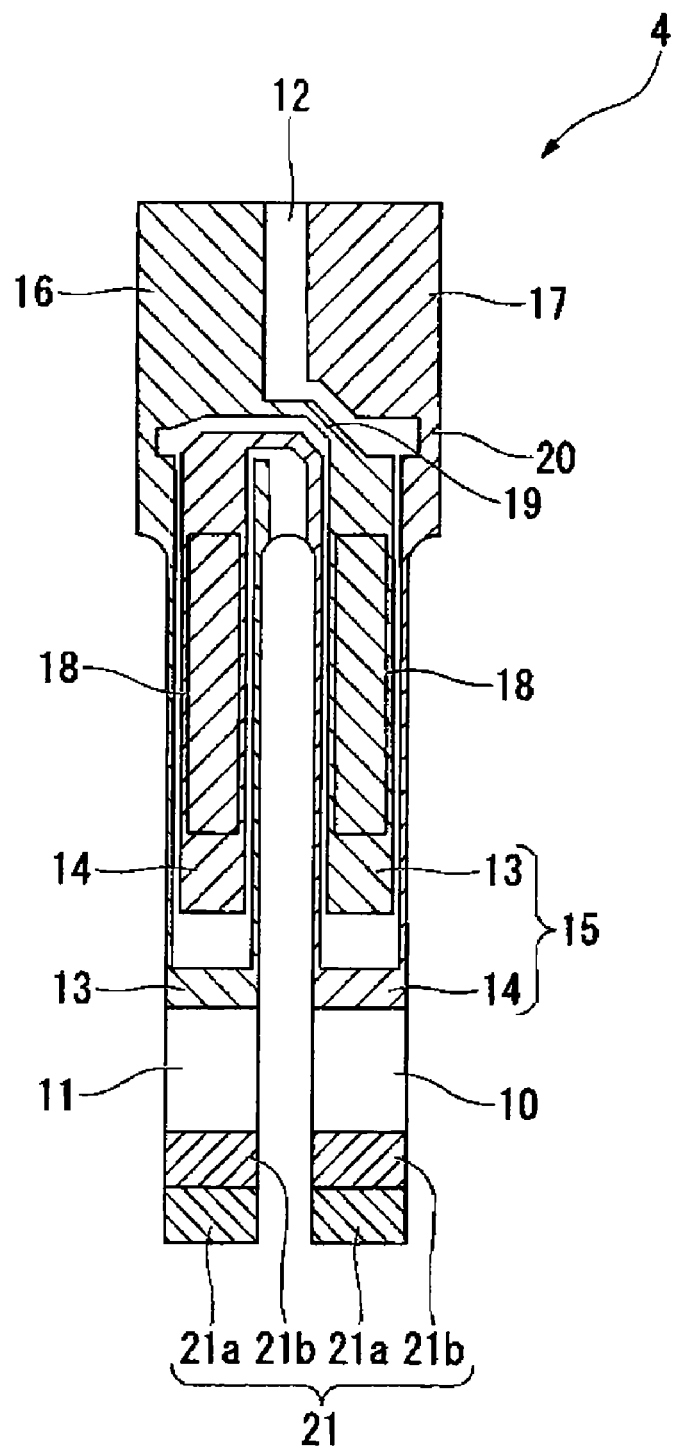
FIG. 6 is a bottom view of the piezoelectric vibration member shown in FIG. 5.
Figure 7:
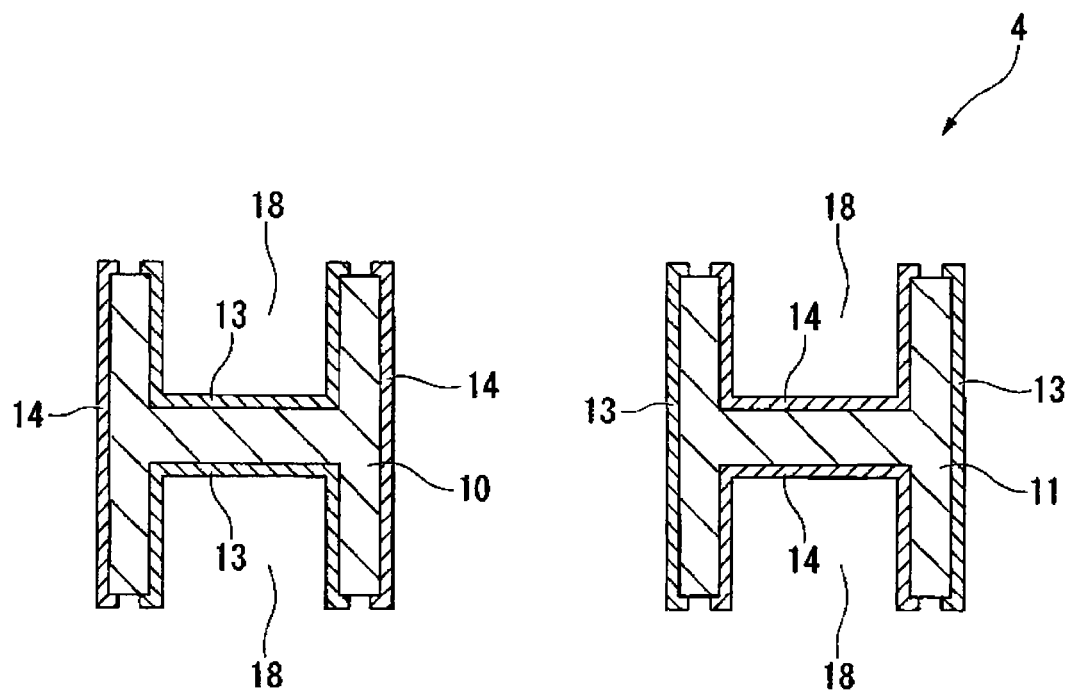
FIG. 7 is a cross-sectional outline view of B-B shown in FIG. 5.

As shown in FIG. 5 to FIG. 7, the piezoelectric vibration member 4 is a tuning fork-like vibration member formed of a piezoelectric material such as crystal, lithium tantalate, lithium niobate or the like, and this vibrates when a predetermined voltage is applied thereto.

The piezoelectric vibration member 4 has a pair of vibration arms 10 and 11 disposed in parallel to each other, a base 12 to integrally fix the base side of the pair of vibration arms 10 and 11, an excitation electrode 15 composed of a first excitation electrode 13 and a second excitation electrode 14 for vibrating the pair of the vibration arms 10 and 11, as formed on the outer surface of the pair of the vibration arms 10 and 11, and mount electrodes 16 and 17 electrically connected with the first excitation electrode 13 and the second excitation electrode 14.

The piezoelectric vibration member 4 in this embodiment comprises, on both the two main faces of the pair of vibration arms 10 and 11, a groove 18 formed along the longitudinal direction of the vibration arms 10 and 11. The groove 18 is formed from the base side to around the intermediate part of the vibration arms 10 and 11.

The excitation electrode 15 composed of the first excitation electrode 13 and the second excitation electrode 14 is an electrode to vibrate the pair of vibration arms 10 and 11 in the direction in which they come near to and get away from each other, at a predetermined resonance frequency, and this is patterned on the outer surface of the pair of vibration arms 10 and 11, as electrically insulated from each other. Concretely, the first excitation electrode 13 is formed mainly on the groove 18 of one vibration arm 10 and on the two side faces of the other vibration arm 11; while the second excitation electrode 14 is formed mainly on the two side faces of one vibration arm 10 and on the groove 18 of the other vibration arm 11.

The first excitation electrode 13 and the second excitation electrode 14 are electrically connected to the mount electrodes 16 and 17 via the routing electrodes 19 and 20, respectively, on the two main faces of the base 12. The piezoelectric vibration member 4 is given a voltage via the mount electrodes 16 and 17.

The above-mentioned excitation electrode 15, mount electrodes 16 and 17 and routing electrodes 19 and 20 are, for example, formed of a coating film of an electroconductive film of chromium (Cr), nickel (Ni), aluminium (Al), titanium (Ti) or the like.

The top of the pair of vibration arms 10 and 11 is coated with a weight metal film 21 for tuning the vibration condition of the arms themselves within a predetermined frequency range (frequency tuning). The weight metal film 21 is divided into two, a rough-tuning film 21a for use in roughly tuning the frequency and a fine-tuning film 21b for use in finely tuning it. With these rough-tuning film 21a and fine-tuning film 21b, the frequency is tuned, whereby the frequency of the pair of vibration arms 10 and 11 can be controlled to fall within a range of the nominal frequency of the device.

The thus-constituted piezoelectric vibration member 4 is, as shown in FIG. 3 and FIG. 4, bump-bonded to the upper face of the base substrate 2 with a bump B of gold or the like. More concretely, on the two bumps B formed on the routing electrodes 36 and 37, as patterned on the upper face of the base substrate 2, a pair of mount electrodes 16 and 17 are bump-bonded as kept in contact with each other. Accordingly, the piezoelectric vibration member 4 is supported as spaced above from the upper face of the base substrate 2, and the mount electrodes 16 and 17 are electrically connected to the routing electrodes 36 and 37, respectively.

Figure 1:
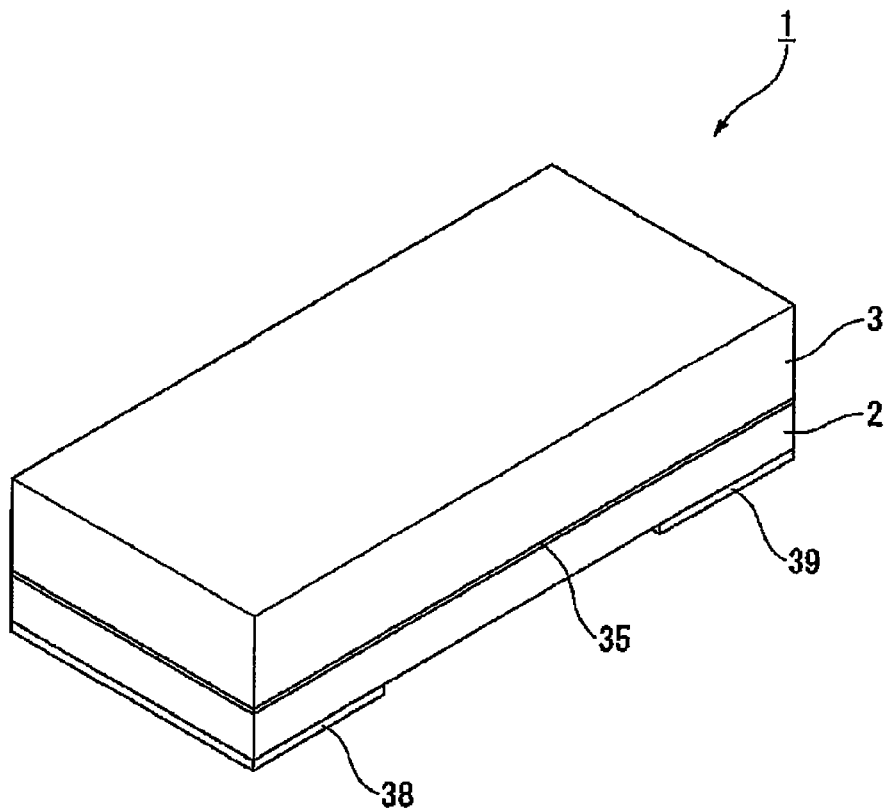
FIG. 1 is a perspective outline view showing one embodiment of the piezoelectric vibrator of the invention.
Figure 2:
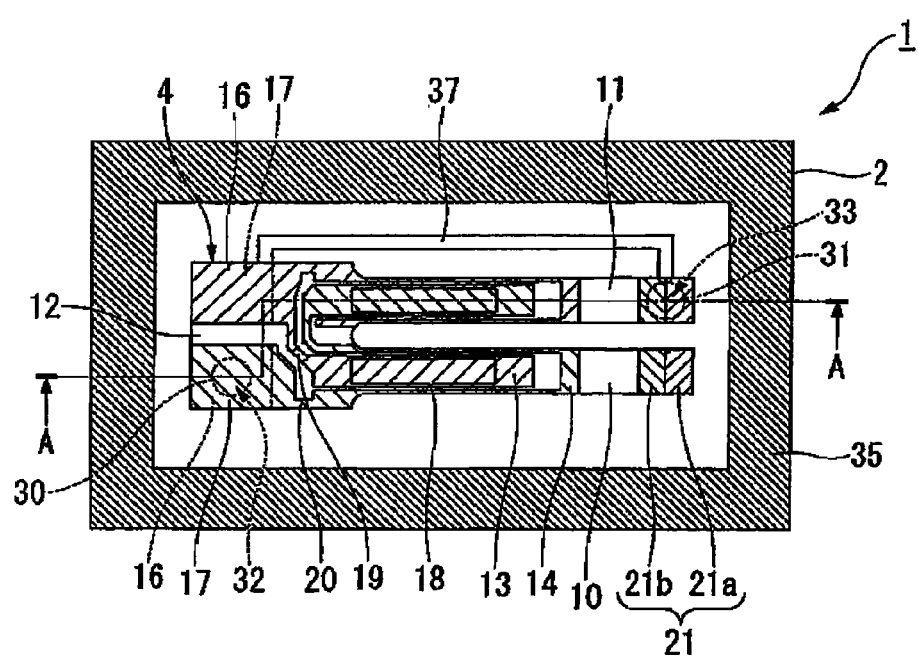
FIG. 2 is an internal configuration view of the piezoelectric vibrator shown in FIG. 1, and is a top view of the piezoelectric vibration member thereof from which the lid substrate was removed.

The lid substrate 3 is a transparent insulating substrate formed of a glass material, for example, soda lime glass; and as shown in FIG. 1, FIG. 3 and FIG. 4, this is shaped to be tabular. On the bonding face side to which the base substrate 2 is bonded, formed is a rectangular recess 3a in which the piezoelectric vibration member 4 is housed. The recess 3a is a cavity recess 3a to be a cavity C to house the piezoelectric vibration member 4 therein when the two substrates 2 and 3 are overlaid. The lid substrate 3 is anodically bonded to the base substrate 2 with the recess 3a kept facing the side of the base substrate 2.

The base substrate 2 is, like the lid substrate 3, a transparent insulating substrate formed of a glass material, for example, soda lime glass; and as shown in FIG. 1 to FIG. 4, this is formed to be tabular and have a size capable of being overlaid on the lid substrate 3.

The base substrate 2 is formed to have a pair of through-holes 30 and 31 in and through the base substrate 2. In this case, the pair of through-holes 30 and 31 are so formed as to be housed inside the cavity C. More precisely, the through-holes 30 and 31 in this embodiment are so formed that one through-hole 30 is positioned on the side of the base 12 of the mounted piezoelectric vibration member 4 and the other through-hole 31 is positioned on the top side of the vibration arms 10 and 11. In this embodiment, a tapered through-hole of which the diameter of the cross section gradually decreases in two stages toward the lower face of the base substrate 2 is described as one example; but not limited to this case, the through-hole may also be a through-hole of which the diameter continuously decreases, or a straight through-hole that runs straightly through the base substrate 2. Anyhow, the through-hole may be any one that runs through the base substrate 2.

In the pair of through-holes 30 and 31, provided are a pair of through-electrodes 32 and 33 that are so formed as to fill up the through-holes 30 and 31. These through-electrodes 32 and 33 are, as shown in FIG. 3, formed by hardening of the paste P containing plural glass beads P1; and these play a role of completely blocking up the through-holes 30 and 31 and keeping the airtightness inside the cavity C, and electrically connecting the external electrodes 38 and 39 with the routing electrodes 36 and 37 as described below. In this embodiment, a case is referred to in which a glass powder or the like is fired into balls (spheres) for the glass beads P1. The thermal expansion coefficient of the glass beads P1 is substantially equal to that of the base substrate 2. Preferably, the glass beads P1 have a diameter of from 20 μm to 50 μm or so.

Figure 8:
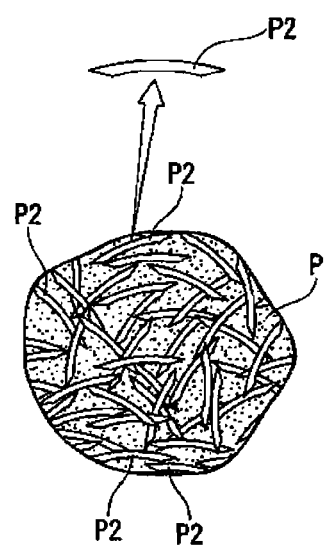
FIG. 8 is an enlarged view of the through-electrode shown in FIG. 3, and is a view showing a paste material containing plural metal fine particles.

As shown in FIG. 8, the paste P contains plural metal fine particles P2 along with plural glass beads P1 therein. The through-electrodes 32 and 33 secure the electric conductivity owing to the mutual contact of the plural metal fine particles P2 with each other in the paste P. One illustrative case is referred to herein, in which the metal fine particles P2 in this embodiment are thin and long fibrous particles (non-spherical particles) of copper or the like.

On the upper face side of the base substrate 2 (the bonding face side thereof to which a lid substrate 3 is bonded), an anodic-bonding film 35 and a pair of routing electrodes 36 and 37 are patterned with an electroconductive material (for example, aluminium), as shown in FIG. 1 to FIG. 4. Of those, the bonding film 35 is formed along the peripheral edge of the base substrate 2 so as to surround the periphery of the recess 3a formed in the lid substrate 3.

The pair of routing electrodes 36 and 37 are so patterned as to electrically connect one through-hole 32 of the pair of through-holes 32 and 33, with one mount electrode 16 of the piezoelectric vibration member 4, and to electrically connect the other through-electrode 33 with the other mount electrode 17 of the piezoelectric vibration member 4.

More precisely, one routing electrode 36 is formed just above one through-electrode 32 so as to be positioned just below the base 12 of the piezoelectric vibration member 4; and the other routing electrode 37 is so formed as to be positioned just above the other through-electrode 33 after drawn from the position adjacent to one routing electrode 36 to the top of the vibration arms 10 and 11 along the vibration arms 10 and 11.

A bump B is formed on the pair of routing electrodes 36 and 37, and via the bump B, the piezoelectric vibration member 4 is mounted. Accordingly, one mount electrode 16 of the piezoelectric vibration member 4 is electrically connected to one through-electrode 32 via one routing electrode 36, and the other mount electrode 17 is electrically connected to the other through-electrode 33 via the other routing electrode 37.

On the lower face of the base substrate 2, formed are external electrodes 38 and 39 to be electrically connected to the pair of through-electrodes 32 and 33, respectively, as shown in FIG. 1, FIG. 3 and FIG. 4. In other words, one external electrode 38 is electrically connected to the first excitation 13 of the piezoelectric vibration member 4 via one through-electrode 32 and one routing electrode 36. The other external electrode 39 is electrically connected to the second excitation electrode 14 of the piezoelectric vibration member 4 via the other through-electrode 33 and the other routing electrode 37.

To operate the thus-constituted piezoelectric vibrator 1, a predetermined driving voltage is applied to the external electrodes 38 and 39 formed on the base substrate 2. Accordingly, a current is applied to the excitation electrode 15 composed of the first excitation electrode 13 and the second excitation electrode 14 of the piezoelectric vibration member 4, whereby the pair of vibration arms 10 and 11 are vibrated at a predetermined frequency in the direction in which they come near to and get away from each other. Based on the vibration of the pair of vibration arms 10 and 11, the vibrator can be used as a time source, a timing source of control signals or the like, a reference signal source, etc.

Figure 9:
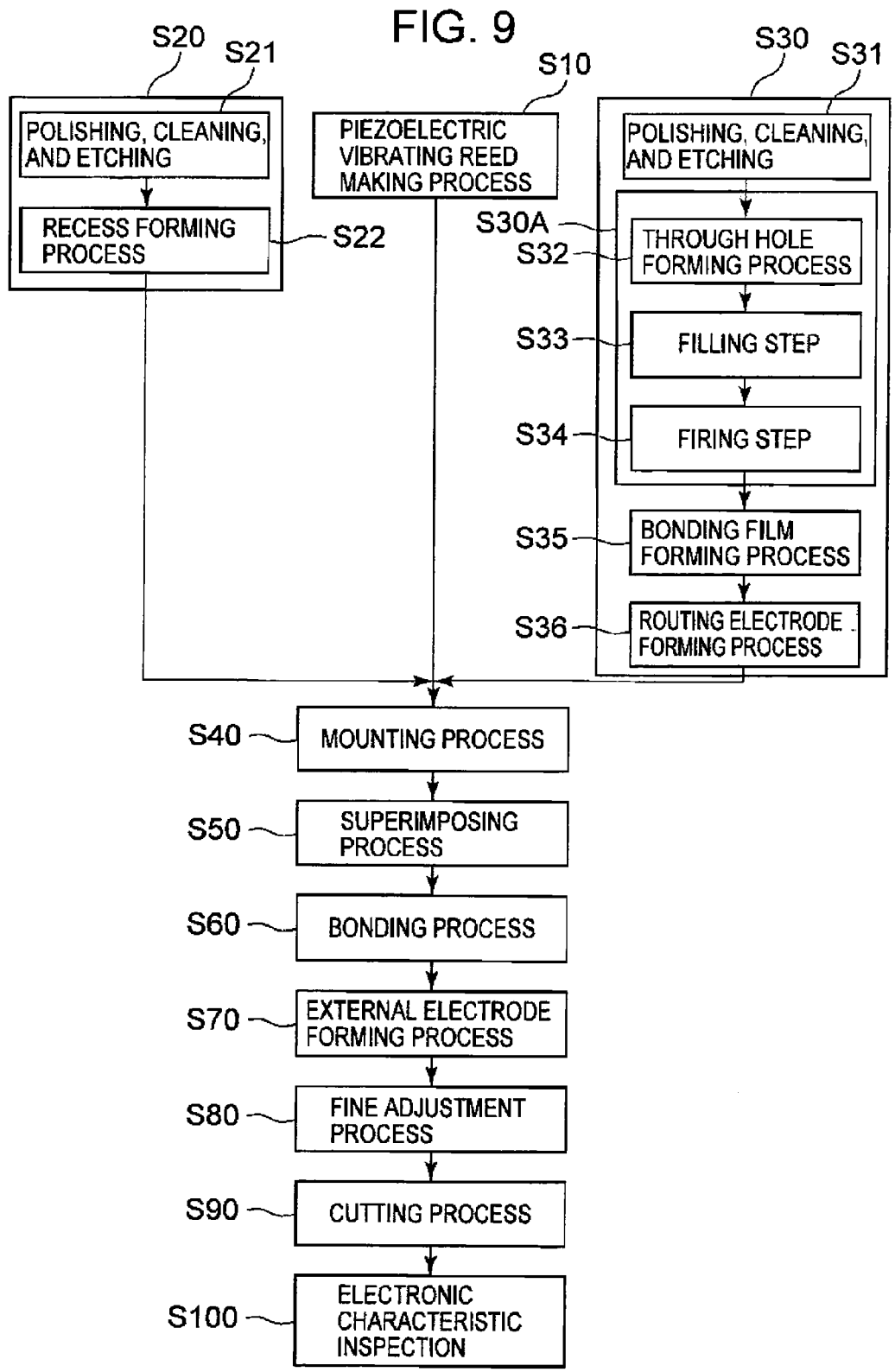
FIG. 9 is a flowchart showing the flow in manufacturing the piezoelectric vibrator shown in FIG. 1.
Figure 10:
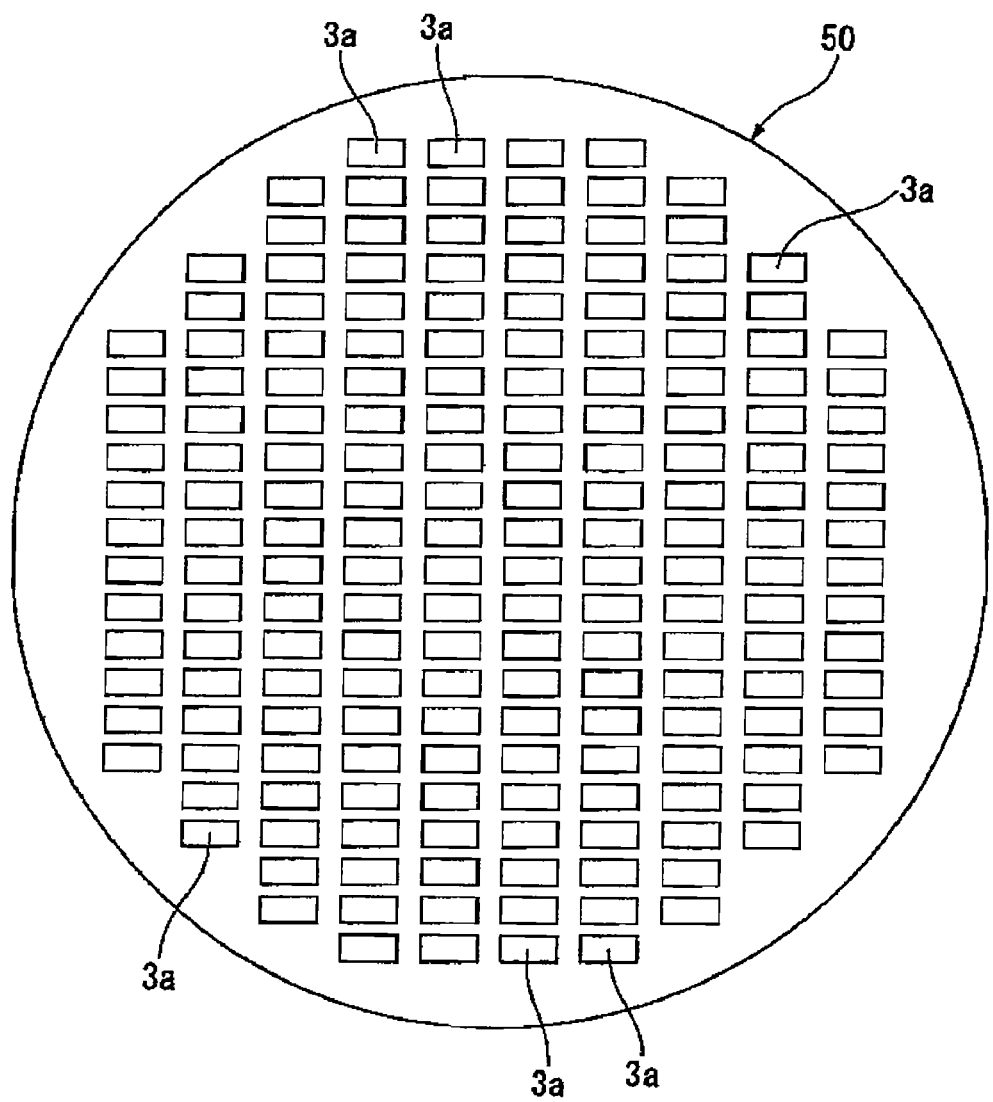
FIG. 10 is a view showing one step in manufacturing piezoelectric vibrators according to the flowchart shown in FIG. 9, and is a view showing the condition where a plurality of recesses are formed in a lid substrate wafer which is an original to be a lid substrate.

Next described is a method for manufacturing a plurality of piezoelectric vibrators 1 mentioned above all at once, by utilizing the base substrate wafer 40 and the lid substrate wafer 50, with reference to the flowchart shown in FIG. 9.

First, a piezoelectric vibration member forming step is attained to form the piezoelectric vibration member 4 shown in FIG. 5 to FIG. 7 (S10). Concretely, first, a rough Lambertian quartz is sliced at a predetermined angle to give a wafer having a predetermined thickness. Subsequently, the wafer is roughly worked by lapping, then the work-affected layer is removed by etching, and thereafter this is mirror-finished by polishing or the like to give a wafer having a predetermined thickness. Subsequently, the wafer is suitably processed by washing or the like, and then the wafer is patterned into an external shape of the piezoelectric vibration member 4 through photolithography, and a metal film is formed and patterned to thereby form the excitation electrode 15, the routing electrodes 19 and 20, the mount electrodes 16 and 17, and the weight metal film 21. Accordingly, a plurality of piezoelectric vibration members 4 are formed.

After the piezoelectric vibration members 4 are formed, they are processed for rough-tuning of resonance frequency. This is attained by irradiating the rough-tuning film 21a of the weight metal film 21 with a laser light to partly evaporate it, thereby changing the weight thereof. Regarding the fine tuning for resonance frequency, the members are processed after mounting. This is described later.

Next, a first wafer forming step is attained for forming a lid substrate wafer 50 to be the lid substrate 3 later up to the state just before anodic bonding (S20). First, soda lime glass is polished to have a predetermined thickness and washed, and then, the work-affected layer of the outermost surface is removed by etching or the like to give a disc-like lid substrate wafer 50 (S21). Next, a recess forming step is attained for forming a plurality of cavity recesses 3a in the line direction by etching or the like in the bonding face of the lid substrate wafer 50 (S22). At this stage, the first wafer forming step is finished.

Next, at the same time or in a timing of before or after the above step, a second wafer forming step is attained for forming a base substrate wafer 40 to be the base substrate 2 later up to the state just before anodic bonding (S30). First, soda lime glass is polished to have a predetermined thickness and washed, and then, the work-affected layer of the outermost surface is removed by etching or the like to give a disc-like base substrate wafer 40 (S31). Next, a through-electrode forming step is attained for forming a plurality of pairs of through-electrodes 32 and 33 in the base substrate wafer 40, using a paste P containing plural metal fine particles P2 and plural glass beads P1 (S30A). Here, the through-electrode forming step is described in detail.

Figure 11:
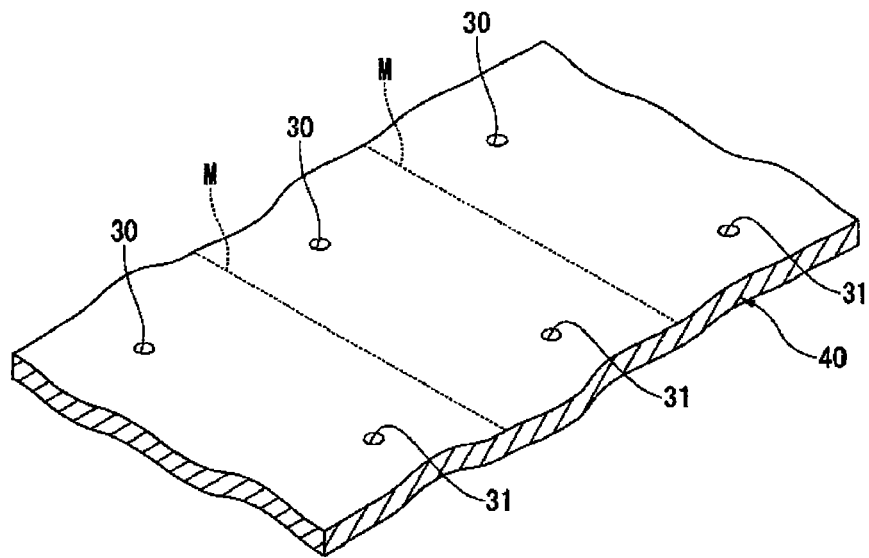
FIG. 11 is a view showing one step in manufacturing piezoelectric vibrators according to the flowchart shown in FIG. 9, and is a view showing the condition where pairs of through-holes are formed in a base substrate wafer which is an original to be a base substrate.
Figure 12:
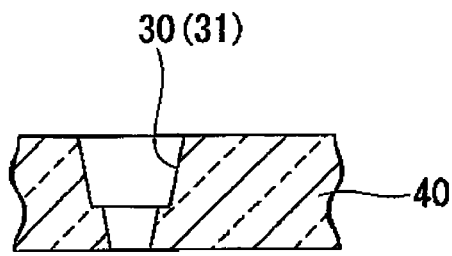
FIG. 12 is a cross-sectional view of the base substrate wafer in the condition shown in FIG. 11.

First, as shown in FIG. 11, a through-hole forming step (S32) is attained for forming a plurality of pairs of through-holes 30 and 31 in and through the base substrate wafer 40. The dotted line M shown in FIG. 11 means a section line for cutting in the subsequent cutting step. In this step, the upper face of the base substrate wafer 40 is processed, for example, according to a pressing method. Accordingly, tapered through-holes 30 and 31 are formed, of which the hole diameter of the cross section gradually decreases in two stages toward the lower face of the base substrate wafer 40, as shown in FIG. 12. A plurality of pairs of through-holes 30 and 31 are so formed as to be housed in the recesses 3a formed in the lid substrate wafer 50, when the two wafers 40 and 50 are overlaid later. Further, they are so positioned that one through-hole 30 can be positioned on the side of the base 12 of the piezoelectric vibration member 4 and the other through-hole 31 can be on the top side of the vibration arms 10 and 11.

In the through-hole forming step, the tapered through-holes of which the hole diameter continuously decreases can be formed according to a sand-blasting method, or straight through-holes running straightly through the base substrate wafer 40 can also be formed.

Figure 13:
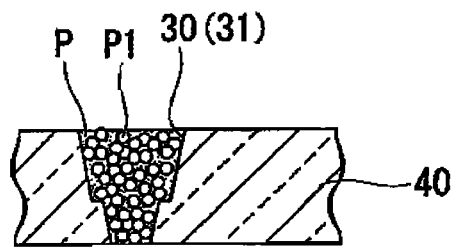
FIG. 13 is a view showing one step in manufacturing piezoelectric vibrators according to the flowchart shown in FIG. 9, and is a view showing the condition where, after the state shown in FIG. 12, a paste is filled in the through-hole.
Figure 14:
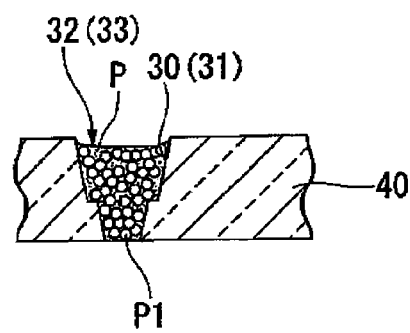
FIG. 14 is a view showing one step in manufacturing piezoelectric vibrators according to the flowchart shown in FIG. 9, and is a view showing the condition where, after the state shown in FIG. 13, the paste is fired and hardened.

Subsequently, as shown in FIG. 13, a filling step is attained for implanting a paste P into these plural through-holes 30 and 31 with no space left therein to block up the through-holes 30 and 31 (S33). In FIG. 13 and FIG. 14, showing the metal fine particles P2 is omitted. Subsequently, a firing step is attained for firing and hardening the filled paste P at a predetermined temperature (S34). Accordingly, the paste P firmly sticks to the inner face of the through-holes 30 and 31.

The paste P contains an organic matter, and when fired, the organic matter may evaporate away. Accordingly, when the paste P is fired, its volume decreases as compared with that before firing. Therefore, when a paste P alone not containing glass beads P1 is implanted into the through-holes 30 and 31 and then fired, then the surface of the paste P may have large depressions formed therein.

However, in this embodiment, the paste P containing plural glass beads P1 is used. Accordingly, after the filling step, the glass beads P1 are kept implanted along with the paste P in the through-holes 30 and 31 after the filling step. Therefore, as compared with a case where the through-holes 30 and 31 are filled with a paste P alone, the amount of the paste P to be used may be reduced by the amount of the glass beads P1 in this embodiment. In other words, the amount of the paste P to be used may be reduced. Therefore, even if the organic matter in the paste P may evaporate in the firing step, the volume reduction of the paste P is small since the amount of the paste P itself is small. Accordingly, as shown in FIG. 14, the surface depressions to appear after the hardening of the paste P are small and ignorable. Therefore, the surface of the base substrate wafer 40 can be in a substantially flat condition relative to the surface of the hardened paste P.

In general, the melting point of glass is higher than the firing temperature of metal fine particles, and therefore in the firing step, the glass beads P1 do not melt. Accordingly, before and after the firing step, the volume of the glass beads P1 does not change.

At the time after the firing step, the through-electrode forming step is finished.

Figure 15:
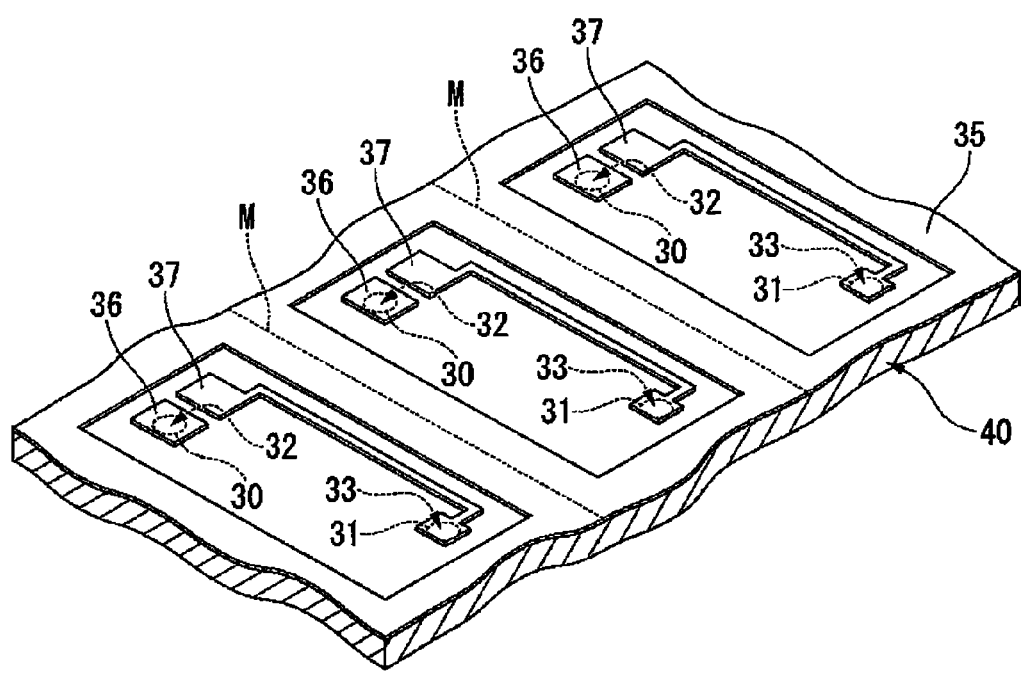
FIG. 15 is a view showing one step in manufacturing piezoelectric vibrators according to the flowchart shown in FIG. 9, and is a view showing the condition where, after the state shown in FIG. 14, a bonding film and a routing electrode are patterned on the upper face of the base substrate wafer.
Figure 16:
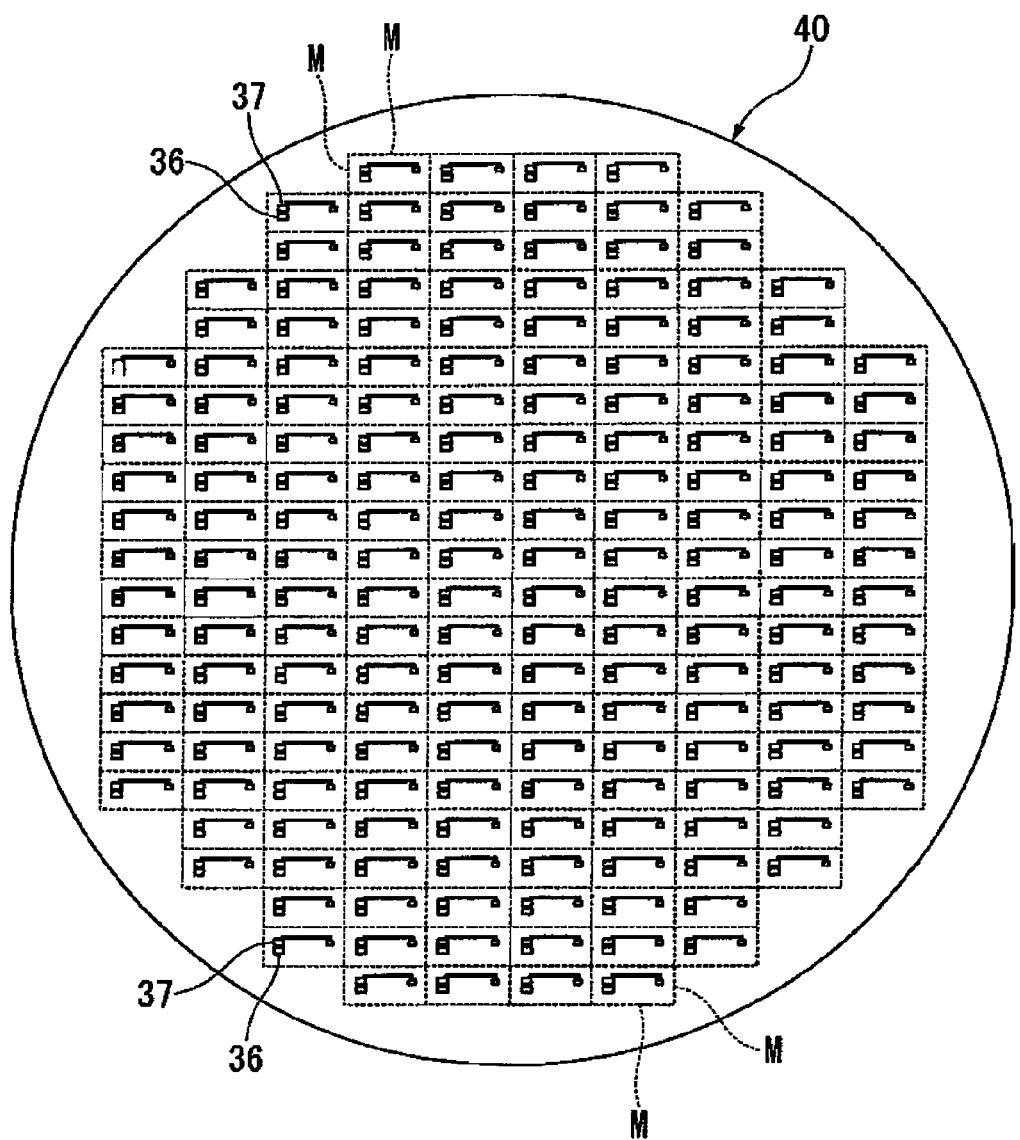
FIG. 16 is an entire view of the base substrate wafer in the state shown in FIG. 15.

Next, a bonding film forming step is attained for forming a bonding film 35 by patterning an electroconductive material on the upper face of the base substrate wafer 40, as shown in FIG. 15 and FIG. 16 (S35); and at the same time, a routing electrode forming step is attained for forming a plurality of routing electrodes 36 and 37 connected electrically with the pair of through-electrodes 32 and 33 (S36). The dotted line M shown in FIG. 15 and FIG. 16 means a section line for cutting in the subsequent cutting step.

In particular, as so mentioned in the above, the through-electrodes 32 and 33 are substantially in a flat condition relative to the upper face of the base substrate wafer 40. Accordingly, the routing electrodes 36 and 37 as patterned on the upper face of the base substrate wafer 40 are kept in airtight contact with the through-electrodes 32 and 33 with no space therebetween. This secures the electric connection between one routing electrode 36 and one through-electrode 32 and the electric connection between the other routing electrode 37 and the other through-electrode 33. At this time, the second wafer forming step is finished.

In FIG. 9, the bonding film forming step (S35) is followed by the routing electrode forming step (S36) as the process sequence; however, in an opposite manner, the routing electrode forming step (S36) may be followed by the bonding film forming step (S35), or the two steps may be attained at the same time. In any process sequence, the same advantage and effect can be exhibited. Accordingly, the process sequence may be optionally changed or modified in any desired order.

Next, a mounting step is attained for bonding the formed, plural piezoelectric vibration members 4 onto the upper face of the base substrate wafer 40 via the routing electrodes 36 and 37 (S40). First, a bump B of gold or the like is formed on the pair of routing electrodes 36 and 37. After the base 12 of the piezoelectric vibration member 4 is put on the bump B, the piezoelectric vibration member 4 is pressed against the bump B while the bump B is heated at a predetermined temperature. Accordingly, the piezoelectric vibration member 4 is mechanically supported by the bump B, and the mount electrodes 16 and 17 are electrically connected with the routing electrodes 36 and 37. Therefore, at this time, the pair of excitation electrodes 15 of the piezoelectric vibration member 4 are electrically connected to the pair of through-electrodes 32 and 33, respectively.

In particular, the piezoelectric vibration member 4 is bump-bonded, and therefore it is supported as spaced above from the upper face of the base substrate wafer 40.

After the mounting of the piezoelectric vibration member 4 is finished, an overlaying step is attained for overlaying the base substrate wafer 40 and the lid substrate wafer 50 (S50). Concretely, the two wafers 40 and 50 are aligned in a correct position based on a reference mark or the like (not shown) as an index. Accordingly, the mounted piezoelectric vibration member 4 is kept housed in the cavity C surrounded by the recess 3a formed in the base substrate wafer 40 and the two wafers 40 and 50.

Figure 17:
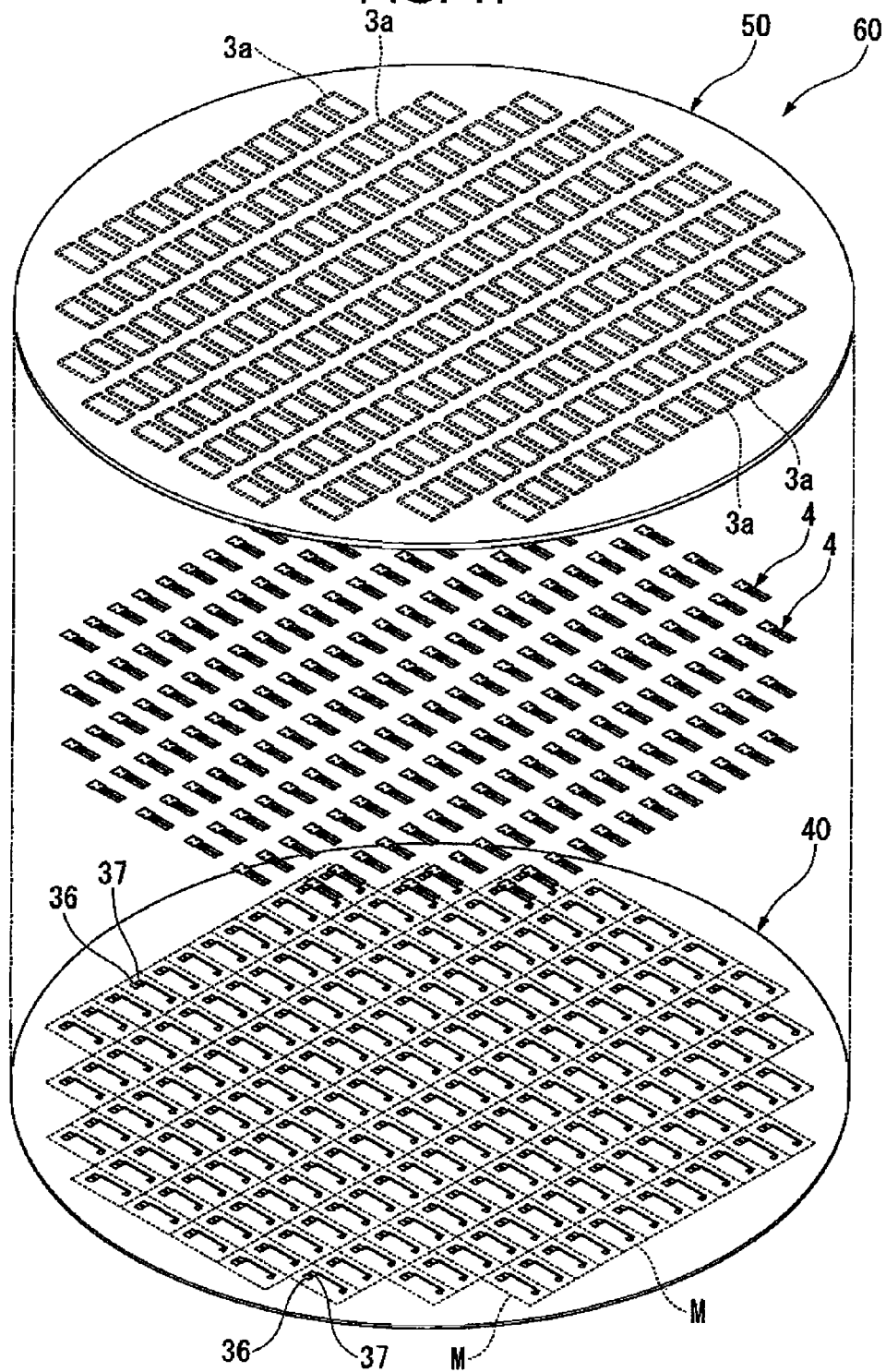
FIG. 17 is a view showing one step in manufacturing piezoelectric vibrators according to the flowchart shown in FIG. 9, and is a perspective exploded view of the wafer body in which the base substrate wafer and the lid substrate wafer are anodically-bonded and the piezoelectric vibration member is housed in the cavity.

After the overlaying step, a bonding step is attained for anodically bonding the overlaid two wafers 40 and 50 by putting them in an anodic bonding apparatus (not shown) and applying a predetermined voltage thereto in a predetermined temperature atmosphere (S60). Concretely, a predetermined voltage is applied between the bonding film 35 and the lid substrate wafer 50. With that, there occurs electrochemical reaction in the interface between the bonding film 35 and the lid substrate wafer 50, whereby the two firmly stick to each other to attain anodic bonding therebetween. Accordingly, the piezoelectric vibration member 4 can be sealed up in the cavity C, and a wafer body 60 as shown in FIG. 17 can be obtained in which the base substrate wafer 40 and the lid substrate wafer 50 are bonded to each other. FIG. 17 illustrates an exploded state of the wafer body 60 for facilitating the understating of the view, in which the illustrative constitution of from the base substrate wafer 40 to the bonding film 35 is omitted. The dotted line M shown in FIG. 17 means a section line for cutting in the subsequent cutting step.

In anodic bonding, the through-holes 30 and 31 formed in the base substrate wafer 40 are completely blocked up by the through-electrodes 32 and 33, and therefore, the airtightness inside the cavity C is not broken by the through-holes 30 and 31. In particular, the paste P to constitute the through-electrodes 32 and 33 firmly sticks to the inner face of the through-holes 30 and 31, and therefore the airtightness inside the cavity C can be surely secured.

After the above-mentioned anodic bonding is finished, an external electrode forming step is attained for forming a plurality of pairs of external electrodes 38 and 39 electrically connected to the pairs of through-electrodes 32 and 33, respectively, by patterning an electroconductive material on the lower face of the base substrate wafer 40 (S70). As a result of this step, the piezoelectric vibration member 4 sealed up in the cavity C can be operated by utilizing the external electrodes 38 and 39.

In particular, also in attaining this step, the through-electrodes 32 and 33 are kept substantially in a flat condition relative to the lower face of the base substrate wafer 40, like in the case of forming the routing electrodes 36 and 37, and therefore the patterned external electrodes 38 and 39 can be kept in airtight contact with the through-electrodes 32 and 33 with no space therebetween. Accordingly, the electric connection between the external electrodes 38 and 39 with the through-electrodes 32 and 33 is secured.

Next, a fine-tuning step is attained for finely tuning the frequency of the individual piezoelectric vibrators 1 sealed up in the cavities C in the state of the wafer body 60 to make it fall within a predetermined range (S80). Concretely, a voltage is applied to the pair of external electrodes 38 and 39 formed on the lower face of the base substrate wafer 40 to thereby vibrate the piezoelectric vibration member 4. Then, with monitoring the frequency, this is irradiated with a laser light from the outside through the lid substrate wafer 50, to thereby evaporate the fine-tuning film 21b of the weight metal film 21. As a result, the weight of the top side of the pair of vibration arms 10 and 11 changes, and therefore the frequency of the piezoelectric vibration member 4 can be finely tuned so as to fall within a predetermined range of a nominal frequency.

After the fine-tuning of frequency is finished, a cutting step is attained for cutting the bonded wafer body 60 to thereby shred it into the individual pieces along the section line M shown in FIG. 17 (S90). As a result, a plurality of two-layer structure-type, surface-mount piezoelectric vibrators 1 as in FIG. 1 can be produced all at once, in which the piezoelectric vibration member 4 is sealed up in the cavity C formed between the base substrate 2 and the lid substrate 3 anodically bonded to each other.

The process sequence may be in an order of the cutting step (S90) of shredding into the individual piezoelectric vibrators 1 followed by the fine-tuning step (S80). However, as so mentioned in the above, in case where the fine-tuning step (S80) is attained previously, then the tuning can be effected in the state of the wafer body 60 and therefore a plurality of piezoelectric vibrators 1 can be finely tuned more efficiently. Accordingly, it is favorable as increasing the throughput.

After this, the internal electric characteristics are inspected (S100). Specifically, the piezoelectric vibration member 4 is checked for the resonance frequency, the resonance resistance, the drive level characteristic (excitation power dependence of the resonance frequency and the resonance resistance), etc. In addition, it is checked also for the insulation resistance characteristic, etc. Finally, the piezoelectric vibrator 1 is checked for the appearance thereof in point of the dimension and the quality, etc. With that, the manufacture of the piezoelectric vibrator 1 is finished.

In particular, in the piezoelectric vibrator 1 of this embodiment, the through-electrodes 32 and 33 can be formed substantially in a flat condition relative to the base substrate 2, and therefore the through-electrodes 32 and 33 can be surely kept in airtight contact with the routing electrodes 36 and 37 and the external electrodes 38 and 39. As a result, stable electric connection between the piezoelectric vibration member 4 with the external electrodes 38 and 39 can be secured, and the operation performance reliability of the piezoelectric vibrator can be enhanced and the quality thereof can be increased. Further, the airtightness inside the cavity C can be secured, and in this point, the quality of the device can be increased. In addition, since the through-holes 32 and 33 can be formed according to a simple method of using the paste P, the working process can be simplified. According to the manufacturing method of this embodiment, a plurality of the above-mentioned piezoelectric vibrators 1 can be manufactured all at once, and therefore the manufacturing cost can be reduced.

The thermal expansion coefficient of the glass beads P1 in the paste P in this embodiment is substantially equal to the thermal expansion coefficient of the base substrate wafer 40.

In the firing step, the glass beads P1 and the base substrate wafer 40 are heated along with the paste P, and therefore, they expand in accordance with the respective thermal expansion coefficient. Specifically, the glass beads P1 in the paste P expand to extrude the peripheral edge part of the through-holes 30 and 31 of the base substrate wafer 40 from the inside thereof. With that, the base substrate wafer 40 expands to broaden the diameter of the through-holes 30 and 31. Accordingly, for example, in case where the thermal expansion coefficient of the glass beads P1 is larger than the thermal expansion coefficient of the base substrate wafer 40, then the expansion level of extruding the peripheral edge part of the through-holes 30 and 31 from the inside thereof by the glass beads P1 in the paste P is larger than the expansion level of broadening the diameter of the through-holes 30 and 31. Therefore, a load is given to the peripheral edge part of the through-holes 30 and 31 and cracks may be formed.

However, the thermal expansion coefficient of the glass beads P1 in the paste P is substantially equal to the thermal expansion coefficient of the base substrate wafer 40, and in the firing step, the expansion level of the glass beads P1 in the paste P can be substantially equal to that of the base substrate wafer 40; and therefore, there is no risk of generation of the above-mentioned phenomenon. Accordingly, the base substrate wafer 40 is prevented from being cracked, and the quality of the piezoelectric vibrator 1 can be thereby increased.

Further, the glass beads P1 are spherical. Therefore, the glass beads P1 are kept in contact with each other in a mode of point contact. Accordingly, the glass beads P1 can be kept in contact with each other, with keeping a space between the glass beads P1. Therefore, even when the glass beads P1 are filled in the through-holes 30 and 31 to a possible highest degree, the paste P containing metal fine particles P2 can be spread from one face side to the other face side of the base substrate 2 through the space secured between the glass beads P1. Accordingly, the electric conductivity of the through-electrodes 32 and 33 to be secured through mutual contact of the electroconductive metal fine particles P2 with each other in the paste P is not retarded by the mutual contact of the insulator glass beads P1 with each other. With that, the electric conductivity of the through-electrodes 32 and 33 can be more stably secured.

In the above-mentioned embodiment, the through-electrodes 32 and 33 are formed by the use of the paste P containing plural glass beads P1 and plural metal fine particles P2; however, in place of the paste P, a glass frit may be used to form the through-electrodes 32 and 33. In case where a glass frit is used, the firing step is also attained for firing and hardening it; and the volume of the glass frit also reduced by firing as compared with the volume thereof before firing, like the paste P. However, since the glass frit containing glass beads P1 is used in the invention, the surface depressions to appear after hardening of the glass frit are small and ignorable. Using the glass frit containing metal fine particles P2 makes it possible to secure the electric conductivity of the through-electrodes 32 and 33.

In the above-mentioned embodiment, an illustrate case is referred to in which the paste P containing thin and long fiber-like metal fine particles P2 is used; however, the shape of the metal fine particles P2 may be any different one. For example, they may be spherical. Also in this case, the metal fine particles P2 can be contacted with each other in a mode of point contact, and therefore the same electric conductivity can be secured. However, when non-spherical metal fine particles P2 such as thin and long fiber-like ones are used, then they may be often kept in contact with each other not in a mode of point contact but in a mode of line contact. Accordingly, for the purpose of more enhancing the electric conductivity of the through-electrodes 32 and 33, it is desirable to use the paste P containing non-spherical metal fine particles P2 rather than spherical ones.

Figure 18A:
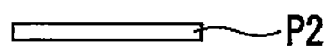
FIG. 18 includes modifications of metal fine particles shown in FIG. 8 in which FIG. 18(*a*) is a strip-like metal fine particle, FIG. 18(*b*) is a waved metal fine particle, FIG. 18(*c*) is a fine particle formed to have a star-shaped cross section, and FIG. 18(*d*) is a fine particle formed to have a crisscross section.
Figure 18B:
Figure 18C:
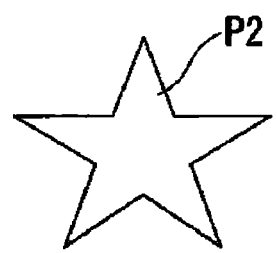
Figure 18D:
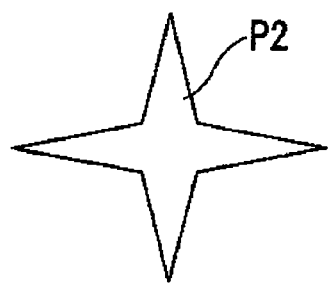

In case where the metal fine particles P2 are non-spherical ones, for example, their shape may be a strip-like one as in FIG. 18(a), or a waved one as in FIG. 18(b), or a star-shaped cross section as in FIG. 18(c), or a crisscross section as in FIG. 18(d).

In the filling step in the above-mentioned embodiment, the paste P may be defoamed (for example, by centrifugal defoaming or vacuuming), and then the paste P may be implanted into the through-holes 30 and 31. Through the pre-defoaming treatment of the paste P, the paste P containing few bubbles may be implanted. Accordingly, the reduction in the volume of the paste P in the firing step may be reduced as much as possible. Therefore, the surface of the base substrate wafer 40 after the firing step and the surface of the hardened paste P can be in a flatter condition. With that, stable electric connection between the piezoelectric vibration member 4 and the external electrodes 38 and 39 can be ensured, and the quality of the devices can be further more increased.

In the above-mentioned embodiment, the glass beads P1 are ball-like ones; but, this is not limitative, and the glass beads P1 may be, for example, columnar or spindle-like ones. However, when the glass beads P1 are spherical, then the glass beads P1 can be kept in contact with each other in a mode of point contact, therefore making it possible to more stably secure the electric conductivity of the through-holes 32 and 33. Accordingly, the glass beads P1 are preferably spherical.

Second Embodiment

The second embodiment of the piezoelectric vibrator of the invention is described below with reference to FIG. 19 to FIG. 26. This embodiment differs from the first embodiment only in the constitution of the through-electrode therein, and the other constitutions thereof are substantially the same as those of the first embodiment; and therefore the same constitutive elements are given the same reference numerals or signs, and their description is omitted.

Figure 19:
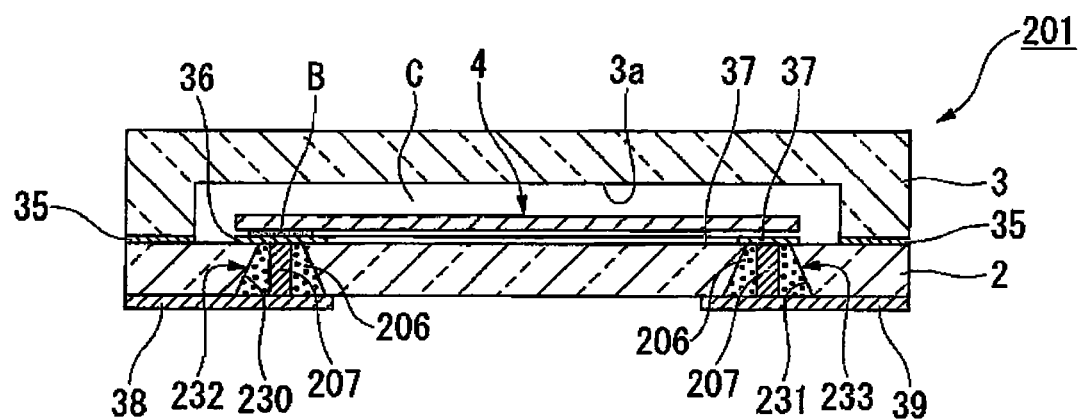
FIG. 19 is a cross-sectional view of a piezoelectric vibrator of the second embodiment of the invention (corresponding to a cross-sectional view cut along the line A-A in FIG. 2).

The piezoelectric vibrator 1 of this embodiment is, as shown in FIG. 19, a surface-mount piezoelectric vibrator that is formed to have a two-layer laminate boxy shape composed of a base substrate 2 and a lid substrate 3, in which a piezoelectric vibration member 4 is housed in the cavity C inside it.

The piezoelectric vibration member 4 is bump-bonded to the upper face of the base substrate 2 with a bump B of gold or the like. More concretely, on the two bumps B formed on the routing electrodes 36 and 37, as patterned on the upper face of the base substrate 2, a pair of mount electrodes 16 and 17 are bump-bonded as kept in contact with each other. Accordingly, the piezoelectric vibration member 4 is supported as spaced above from the upper face of the base substrate 2, and the mount electrodes 16 and 17 are electrically connected to the routing electrodes 36 and 37, respectively.

Like the lid substrate 3, the base substrate 2 is a transparent insulating substrate formed of a glass material, for example, soda lime glass, and this is formed to be tabular and have a size capable of being overlaid on the lid substrate 3.

The base substrate 2 is formed to have a pair of through-holes 230 and 231 in and through the base substrate 2. In this case, the pair of through-holes 230 and 231 are so formed as to be housed inside the cavity C. More precisely, the through-holes 230 and 231 in this embodiment are so formed that one through-hole 230 is positioned on the side of the base 12 of the mounted piezoelectric vibration member 4 and the other through-hole 231 is positioned on the top side of the vibration arms 10 and 11. In this embodiment, a tapered through-hole of which the diameter of the cross section gradually decreases from the lower face toward the upper face of the base substrate 2 is described as one example; but not limited to this case, the through-hole may also be a straight through-hole that runs straightly through the base substrate 2. Anyhow, the through-hole may be any one that runs through the base substrate 2.

In the pair of through-holes 230 and 231, provided are a pair of through-electrodes 232 and 233 that are so formed as to fill up the through-holes 230 and 231. These through-electrodes 232 and 233 are formed of a cylindrical body 206 and a core part 207 integrally fixed to the through-holes 230 and 231 by firing; and these play a role of completely blocking up the through-holes 230 and 231 and keeping the airtightness inside the cavity C, and electrically connecting the external electrodes 38 and 39 with the routing electrodes 36 and 37 as described below.

Figure 20:
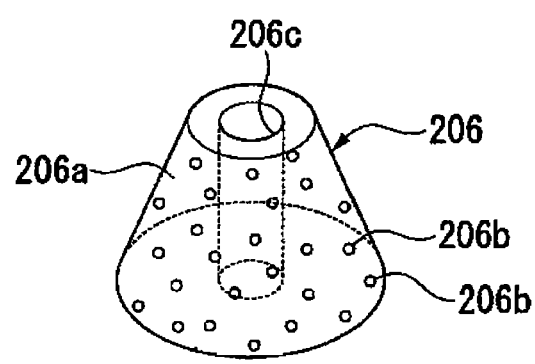
FIG. 20 is a perspective view of a cylindrical body to constitute the through-electrode shown in FIG. 19.

As shown in FIG. 20, the cylindrical body 206 is formed by mixing a pasty glass frit 206a and glass beads 206b formed of the same glass material as that of the base substrate 2, and firing the mixture. The cylindrical body 206 is formed to be cylindrical, having two flat ends and having a length substantially equal to the thickness of the base substrate 2. In the center of the cylindrical body 206, disposed is the core part 207 to run through the cylindrical body 206. In this embodiment, in accordance with the shape of the through-holes 230 and 231, the outer shape of the cylindrical body 206 is formed to have a conical shape (having a tapered cross section). As shown in FIG. 19, the cylindrical body 206 is fired as kept implanted in the through-holes 230 and 231 and is thereby firmly fixed to the through-holes 230 and 231.

Here, in general, bismuth or the like is mixed in the pasty glass frit 206a, and therefore, the hardness of the glass frit is low. For example, in case where soda lime glass is used for the base substrate 2, the hardness of soda lime glass is 570 HV (Vickers hardness) while the hardness of the glass frit 206a is 410 HV. In this embodiment, the glass frit 206a is mixed with glass beads 206b of the same material as that of the base substrate 2, and the hardness of the mixture is about 500 HV and is near to the hardness of the base substrate 2. In case where the outer diameter of the core part 207 is 200 μm, the outer diameter of through-holes 230 and 231 on the side thereof on which the basis part 208 is disposed is 220 μm, and the outer diameter thereof on the side opposite to the side on which the basis part 208 is disposed is 400 μm, and when the glass beads 206b have a diameter of from 5 to 20 μm, then generation of bubbles may be inhibited. By suitably defining the volume ratio of the glass frit 206a to the glass beads 206b, the glass frit 206a must be kept pasty. Further, the glass beads 206b employed herein are those capable of softening at a temperature higher by at least 50° C. than the firing temperature of the glass frit 206a.

The core part 7 is an electroconductive core formed of a metal material to be columnar, and this is so formed as to have two flat ends and have a length substantially equal to the thickness of the base substrate 2, like the cylindrical body 206. The core part 207 is positioned in the center hole 206c of the cylindrical body 206, and is firmly fixed to the cylindrical body 206 by firing of the cylindrical body 206.

The electric conductivity of the through-electrodes 232 and 233 is secured through the electroconductive core part 207.

On the upper face side of the base substrate 2, an anodic-bonding film 35 and a pair of routing electrodes 36 and 37 are patterned with an electroconductive material. Of those, the bonding film 35 is formed along the peripheral edge of the base substrate 2 so as to surround the recess 3a formed in the lid substrate 3.

A bump B is formed on the pair of routing electrodes 36 and 37, and via the bump B, the piezoelectric vibration member 4 is mounted. Accordingly, one mount electrode 16 of the piezoelectric vibration member 4 is electrically connected to one through-electrode 232 via one routing electrode 36, and the other mount electrode 17 is electrically connected to the other through-electrode 233 via the other routing electrode 37.

On the lower face of the base substrate 2, formed are external electrodes 38 and 39 to be electrically connected to the pair of through-electrodes 232 and 233, respectively. In other words, one external electrode 38 is electrically connected to the first excitation 13 of the piezoelectric vibration member 4 via one through-electrode 232 and one routing electrode 36. The other external electrode 39 is electrically connected to the second excitation electrode 14 of the piezoelectric vibration member 4 via the other through-electrode 233 and the other routing electrode 37.

Figure 21:
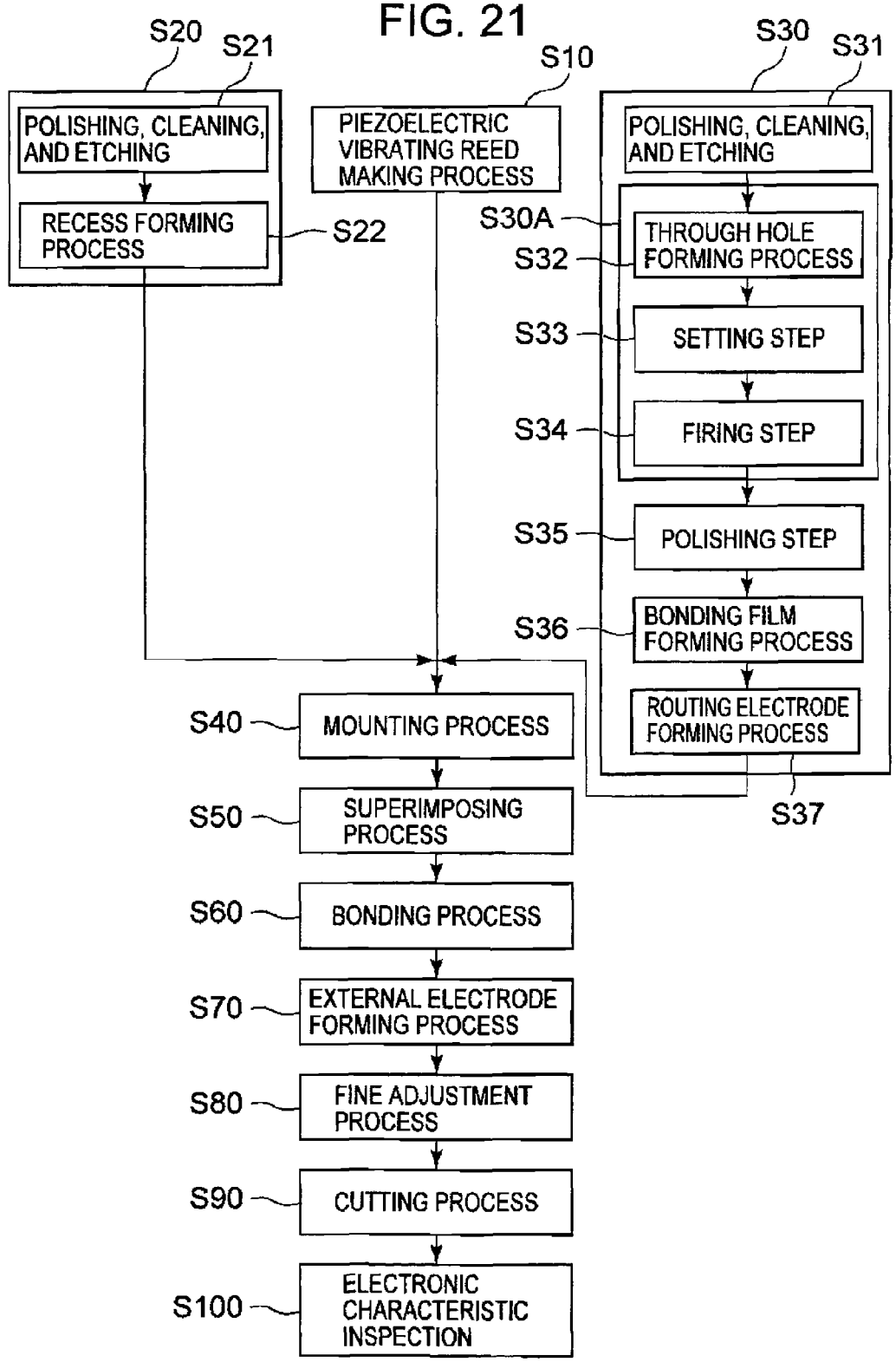
FIG. 21 is a flowchart showing the flow in manufacturing the piezoelectric vibrator of the second embodiment of the invention.

Next described is a method for manufacturing a plurality of piezoelectric vibrators 1 mentioned above all at once, by utilizing the base substrate wafer 40 and the lid substrate wafer 50, with reference to the flowchart shown in FIG. 21.

First, a piezoelectric vibration member forming step is attained to form the piezoelectric vibration member 4 (see FIG. 5 to FIG. 7) (S10). Concretely, first, a rough Lambertian quartz is sliced at a predetermined angle to give a wafer having a predetermined thickness. Subsequently, the wafer is roughly worked by lapping, then the work-affected layer is removed by etching, and thereafter this is mirror-finished by polishing or the like to give a wafer having a predetermined thickness. Subsequently, the wafer is suitably processed by washing or the like, and then the wafer is patterned into an external shape of the piezoelectric vibration member 4 through photolithography, and a metal film is formed and patterned to thereby form the excitation electrode 15, the routing electrodes 19 and 20, the mount electrodes 16 and 17, and the weight metal film 21. Accordingly, a plurality of piezoelectric vibration members 4 are manufactured.

After the piezoelectric vibration members 4 are manufactured, they are processed for rough-tuning of resonance frequency. This is attained by irradiating the rough-tuning film 21a of the weight metal film 21 with a laser light to partly evaporate it, thereby changing the weight thereof. Regarding the fine tuning for resonance frequency, the members are processed after mounting. This is described later.

Next, a first wafer forming step is attained for forming a lid substrate wafer 50 to be the lid substrate 3 later up to the state just before anodic bonding (S20). First, soda lime glass is polished to have a predetermined thickness and washed, and then, the work-affected layer of the outermost surface is removed by etching or the like to give a disc-like lid substrate wafer 50 (see FIG. 10) (S21). Next, a recess forming step is attained for forming a plurality of cavity recesses 3a in the line direction by etching or the like in the bonding face of the lid substrate wafer 50 (S22). At this stage, the first wafer forming step is finished.

Next, at the same time or in a timing of before or after the above step, a second wafer forming step is attained for forming a base substrate wafer 40 to be the base substrate 2 later up to the state just before anodic bonding (S30). First, soda lime glass is polished to have a predetermined thickness and washed, and then, the work-affected layer of the outermost surface is removed by etching or the like to give a disc-like base substrate wafer 40 (S31). Next, a through-electrode forming step is attained for forming a plurality of pairs of through-electrodes 232 and 233 in the base substrate wafer 40 (S30A). Here, the through-electrode forming step is described in detail.

Figure 22:
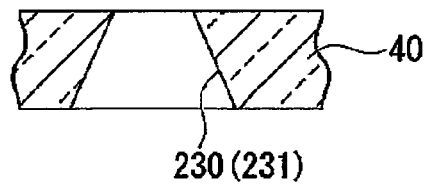
FIG. 22 is a cross-sectional view of the base substrate wafer in forming a through-hole in the second embodiment of the invention.

First, a through-hole forming step (S32) is attained for forming a plurality of pairs of through-holes 230 and 231 in and through the base substrate wafer 40 (see FIG. 11). In this step, the lower face of the base substrate wafer 40 is processed, for example, according to a sand-blasting method. Accordingly, tapered through-holes 230 and 231 are formed, of which the hole diameter of the cross section gradually decreases from the lower face toward the lower face of the base substrate wafer 40, as shown in FIG. 22. A plurality of pairs of through-holes 230 and 231 are so formed as to be housed in the recesses 3a formed in the lid substrate wafer 50, when the two wafers 40 and 50 are overlaid later. Further, they are so positioned that one through-hole 230 can be positioned on the side of the base 12 of the piezoelectric vibration member 4 and the other through-hole 231 can be on the top side of the vibration arms 10 and 11.

Figure 23:
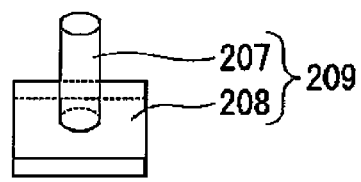
FIG. 23 is a perspective view of a tack member for use in manufacturing piezoelectric vibrators according to the flowchart shown in FIG. 21.
Figure 24:
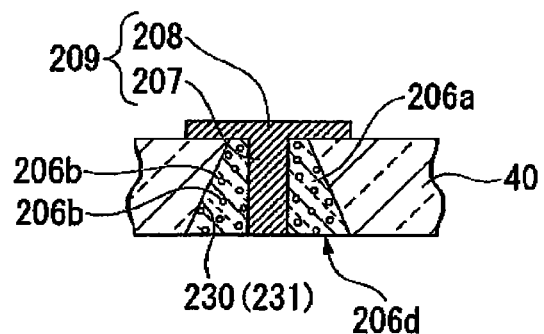
FIG. 24 is a view showing one step in manufacturing piezoelectric vibrators according to the flowchart shown in FIG. 21, and is a view showing the condition where a filler is filled in a through-hole and a tack member is disposed therein.

Subsequently, a setting step is attained for disposing the core part 207 of a tack member 209 in the plural through-holes 230 and 231, and filling a filler 206d prepared by mixing a glass frit 206a of a glass material with glass beads 206b formed of the same material as that of the base substrate 2, in the through-holes 230 and 231 (S33). In this stage, as the tack member 209, used is an electroconductive tack member 209 that comprises a tabular basis part 208 and a core part 207 formed to extend from the basis part 208 in the direction substantially perpendicular to the surface of the basis part 208 to a length substantially equal to the thickness of the base substrate wafer 40 and to have a flat end, as shown in FIG. 23. Further, as shown in FIG. 24, the core part 207 is inserted until the basis part 208 of the tack member 209 is kept in contact with the base substrate wafer 40. In this, the tack member 209 must be so positioned that the two ends of the core part 207 can be substantially in a flat condition relative to the surface of the base substrate wafer 40. However, the tack member 209 having the core part 207 formed on the basis part 208 is used, the two ends of the core part 207 can be easily and surely in a flat condition relative to the surface of the base substrate 40 in a simple operation of merely pushing the basis part 208 until it is kept in contact with the base substrate wafer 40. Accordingly, the workability in the setting step can be enhanced.

Moreover, the pasty glass frit 206a can be surely filled in the through-holes 230 and 231 by making the basis part 208 in contact with the surface of the base substrate wafer 40.

Further, since the basis part 208 is formed to be tabular, even when the base substrate wafer 40 is put on a flat face such as a desk or the like after the setting step and before the subsequent firing step, it may be kept stable but is not shaky. In this point, the workability can be enhanced.

Figure 25:
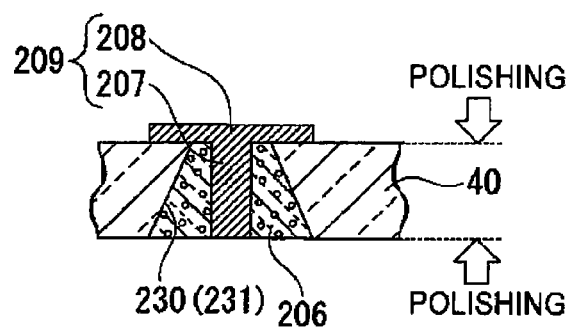
FIG. 25 is a view showing one step in manufacturing piezoelectric vibrators according to the flowchart shown in FIG. 21, and is a view showing the condition where, after the state shown in FIG. 24, the glass frit is fired.
Figure 26:
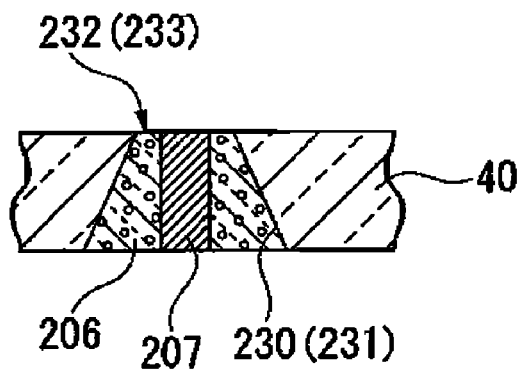
FIG. 26 is a view showing one step in manufacturing piezoelectric vibrators according to the flowchart shown in FIG. 21, and is a view showing the condition where, after the state shown in FIG. 25, the basis part of the tack member is polished.

Subsequently, a firing step is attained for firing the implanted filler at a predetermined temperature (S34). Accordingly, the through-holes 230 and 231, the filler 206d implanted in the through-holes 230 and 231, and the tack member 209 disposed in the filler 206d firmly stick to each other. In firing, the basis part 208 is also fired together with them, and therefore they can be integrally fixed to each other with the two ends of the filler 206d and the core part 207 all kept substantially in a flat condition relative to the surface of the base substrate wafer 40. When the filler 206d is fired, then it is solidified to be the cylindrical body 206. Subsequently, as shown in FIG. 25, after the firing, a polishing step is attained for polishing and removing the basis part 208 of the tack member 209 (S35). Accordingly, the basis part 208 that has played a role of positioning the cylindrical body 206 and the core part 207 can be removed, and only the core part 207 can be left inside the cylindrical body 206. In addition, since the cylindrical body 206 is so designed that its hardness is on the same level as that of the hardness of the base substrate wafer 40, the cylindrical body 206 is prevented from being over-cut/over-polished during cutting/polishing. As a result, a plurality of pairs of through-electrodes 232 and 233 can be formed in which the cylindrical body 206 and the core part 207 are integrally fixed to each other, as shown in FIG. 26.

In particular, in forming the through-electrodes 232 and 233, no paste is used in the electroconductive part, but a cylindrical body 206 of a glass material and an electroconductive core part 207 are used to form the through-electrodes 232 and 233, different from conventional ones. In case where a paste is used in the electroconductive part, the organic matter in the paste may evaporate in firing with the result that the paste volume may remarkably decrease as compared with that before firing. Accordingly, in case where only a paste is implanted in the through-holes 230 and 231, then the paste surface may have large depressions after firing.

In case where the through-electrodes 232 and 233 are formed of a glass frit and an electroconductive core part, foams or depressions may be formed in the fired glass frit in firing. In addition, even when a glass frit is fired, a glass frit generally contains bismuth as mixed therein, and therefore the fired glass frit is soft and its hardness may be lower than the hardness of the base substrate wafer 40. Accordingly, in the subsequent cutting/polishing step, the glass frit may be over-cut/over-polished, and its surface may have depressions.

However, as described in the above, to form the cylindrical body 206, a filler 206d is used, which is prepared by mixing the glass frit 206a and glass beads 206b having a higher hardness than that of the glass frit, and therefore, there is no risk of forming any large depressions in the surface after firing. The volume of the cylindrical body 206 may decrease in some degree by firing, but it is not so remarkable as to form visible depressions, and it may be within an ignorable range. In the cutting/polishing step, the back of the base substrate wafer 40 (the face on which the basis part 208 of the tack member 209 is not disposed) may be polished to be flat.

Accordingly, as so mentioned above, the surface of the base substrate wafer 40 and the two ends of the cylindrical body 206 and the core part 207 can be substantially in a flat condition. In other words, the surface of the base substrate wafer 40 can be substantially in a flat condition relative to the surface of the through-electrodes 232 and 233. After the polishing step, the through-hole forming step is finished.

Next, a bonding film forming step is attained for forming a bonding film 35 by patterning an electroconductive material on the upper face of the base substrate wafer 40 (S36); and at the same time, a routing electrode forming step is attained for forming a plurality of routing electrodes 36 and 37 connected electrically with the pair of through-electrodes 232 and 233, respectively (S37) (see FIG. 15, FIG. 16).

In particular, as so mentioned in the above, the through-electrodes 232 and 233 are substantially in a flat condition relative to the upper face of the base substrate wafer 40. Accordingly, the routing electrodes 36 and 37 as patterned on the upper face of the base substrate wafer 40 are kept in airtight contact with the through-electrodes 232 and 233 with no space therebetween. This secures the electric connection between one routing electrode 36 and one through-electrode 232 and the electric connection between the other routing electrode 37 and the other through-electrode 233. At this time, the second wafer forming step is finished.

In FIG. 21, the bonding film forming step (S36) is followed by the routing electrode forming step (S37) as the process sequence; however, in an opposite manner, the routing electrode forming step (S37) may be followed by the bonding film forming step (S36), or the two steps may be attained at the same time. In any process sequence, the same advantage and effect can be exhibited. Accordingly, the process sequence may be optionally changed or modified in any desired order.

Next, a mounting step is attained for bonding the formed, plural piezoelectric vibration members 4 onto the upper face of the base substrate wafer 40 via the routing electrodes 36 and 37 (S40). First, a bump B of gold or the like is formed on the pair of routing electrodes 36 and 37. After the base 12 of the piezoelectric vibration member 4 is put on the bump B, the piezoelectric vibration member 4 is pressed against the bump B while the bump B is heated at a predetermined temperature. Accordingly, the piezoelectric vibration member 4 is mechanically supported by the bump B, and the mount electrodes 16 and 17 are electrically connected with the routing electrodes 36 and 37. Therefore, at this time, the pair of excitation electrodes 15 of the piezoelectric vibration member 4 are electrically connected to the pair of through-electrodes 232 and 233, respectively.

In particular, the piezoelectric vibration member 4 is bump-bonded, and therefore it is supported as spaced above from the upper face of the base substrate wafer 40.

After the mounting of the piezoelectric vibration member 4 is finished, an overlaying step is attained for overlaying the base substrate wafer 40 and the lid substrate wafer 50 (S50). Concretely, the two wafers 40 and 50 are aligned in a correct position based on a reference mark or the like (not shown) as an index. Accordingly, the mounted piezoelectric vibration member 4 is kept housed in the cavity C surrounded by the recess 3a formed in the base substrate wafer 40 and the two wafers 40 and 50.

After the overlaying step, a bonding step is attained for anodically bonding the overlaid two wafers 40 and 50 by putting them in an anodic bonding apparatus (not shown) and applying a predetermined voltage thereto in a predetermined temperature atmosphere (S60). Concretely, a predetermined voltage is applied between the bonding film 35 and the lid substrate wafer 50. With that, there occurs electrochemical reaction in the interface between the bonding film 35 and the lid substrate wafer 50, whereby the two firmly stick to each other to attain anodic bonding therebetween. Accordingly, the piezoelectric vibration member 4 can be sealed up in the cavity C, and a wafer body 60 can be obtained in which the base substrate wafer 40 and the lid substrate wafer 50 are bonded to each other (see FIG. 17).

In anodic bonding, the through-holes 230 and 231 formed in the base substrate wafer 40 are completely blocked up by the through-electrodes 232 and 233, and therefore, the airtightness inside the cavity C is not broken by the through-holes 230 and 231. In particular, the cylindrical body 206 and the core part 207 are integrally fixed together by firing and these firmly stick to the through-holes 230 and 231, therefore securing the airtightness inside the cavity C.

After the above-mentioned anodic bonding is finished, an external electrode forming step is attained for forming a plurality of pairs of external electrodes 38 and 39 electrically connected to the pairs of through-electrodes 232 and 233, respectively, by patterning an electroconductive material on the lower face of the base substrate wafer 40 (S70). As a result of this step, the piezoelectric vibration member 4 sealed up in the cavity C can be operated by utilizing the external electrodes 38 and 39.

In particular, also in attaining this step, the through-electrodes 232 and 233 are kept substantially in a flat condition relative to the lower face of the base substrate wafer 40, like in the case of forming the routing electrodes 36 and 37, and therefore the patterned external electrodes 38 and 39 can be kept in airtight contact with the through-electrodes 232 and 233 with no space therebetween. Accordingly, the electric connection between the external electrodes 38 and 39 with the through-electrodes 232 and 233 is secured.

Next, a fine-tuning step is attained for finely tuning the frequency of the individual piezoelectric vibrators 1 sealed up in the cavities C in the state of the wafer body 60 to make it fall within a predetermined range (S80). Concretely, a voltage is applied to the pair of external electrodes 38 and 39 formed on the lower face of the base substrate wafer 40 to thereby vibrate the piezoelectric vibration member 4. Then, with monitoring the frequency, this is irradiated with a laser light from the outside through the lid substrate wafer 50, to thereby evaporate the fine-tuning film 21*b* of the weight metal film 21. As a result, the weight of the top side of the pair of vibration arms 10 and 11 changes, and therefore the frequency of the piezoelectric vibration member 4 can be finely tuned so as to fall within a predetermined range of a nominal frequency.

After the fine-tuning of frequency is finished, a cutting step is attained for cutting the bonded wafer body 60 to thereby shred it into the individual pieces along the section line M (see FIG. 17) (S90). As a result, a plurality of two-layer structure-type, surface-mount piezoelectric vibrators 1 can be manufactured all at once, in which the piezoelectric vibration member 4 is sealed up in the cavity C formed between the base substrate 2 and the lid substrate 3 anodically bonded to each other.

The process sequence may be in an order of the cutting step (S90) of shredding into the individual piezoelectric vibrators 1 followed by the fine-tuning step (S80). However, as so mentioned in the above, in case where the fine-tuning step (S80) is attained previously, then the tuning can be effected in the state of the wafer body 60 and therefore a plurality of piezoelectric vibrators 1 can be finely tuned more efficiently. Accordingly, it is favorable as increasing the throughput.

After this, the internal electric characteristics are inspected (S100). Specifically, the piezoelectric vibration member 4 is checked for the resonance frequency, the resonance resistance, the drive level characteristic (excitation power dependence of the resonance frequency and the resonance resistance), etc. In addition, it is checked also for the insulation resistance characteristic, etc. Finally, the piezoelectric vibrator 1 is checked for the appearance thereof in point of the dimension and the quality, etc. With that, the manufacture of the piezoelectric vibrator 1 is finished.

In particular, in the piezoelectric vibrator 1 of this embodiment, the through-electrodes 232 and 233 with no surface depression can be formed substantially in a flat condition relative to the base substrate 2, and therefore the through-electrodes 232 and 233 can be surely kept in airtight contact with the routing electrodes 36 and 37 and the external electrodes 38 and 39. As a result, stable electric connection between the piezoelectric vibration member 4 with the external electrodes 38 and 39 can be secured, and the operation performance reliability of the piezoelectric vibrator can be enhanced and the quality thereof can be increased. Moreover, since the electroconductive core part 207 is used in forming the through-electrodes 232 and 233, and therefore the through-electrodes can have extremely stable electric conductivity.

Further, the airtightness inside the cavity C can be secured, and in this point, the quality of the device can be increased. In particular, since the cylindrical body 206 in this embodiment is formed of a mixture of a glass frit 206*a* and glass beads 206*b*, it hardly deforms or its volume hardly decreases in the subsequent stage of firing. Accordingly, high-quality through-electrodes 232 and 233 can be formed, and the airtightness in the cavity C can be more secured. Therefore, the quality of the piezoelectric vibrator 1 can be increased.

According to the manufacturing method of this embodiment, a plurality of the above-mentioned piezoelectric vibrators 1 can be manufactured all at once, and therefore the manufacturing cost can be reduced.

By merely mixing the glass frit 206*a* to constitute the cylindrical body 206 with easily available glass beads 206*b*, the through-electrodes 232 and 233 can be formed in which the cylindrical body 206 surely exhibits its function and the airtightness inside the through-holes 230 and 231 is secured.

Further, in case where the core part 207 and the filler 206*d*, as prepared by mixing the glass frit 206*a* and the glass beads 206*b* having a higher hardness than that of the glass frit 206*a* to constitute the cylindrical body 206, are disposed in the through-holes 230 and 231, and then fired, and thereafter the surface of the base substrate 2 and the through-electrodes 232 and 233 is polished in the subsequent polishing step, the cylindrical body 206 is prevented from being excessively polished, since the hardness of the cylindrical body 206 is nearer to (substantially equal to) the hardness of the base substrate 2 as compared with the case of the glass frit 206*a* alone. In other words, in case where the routing electrodes 36 and 37 are formed on the upper face of the base substrate 2 in the subsequent step for electrically connecting the piezoelectric vibration member 4 to the through-electrodes 232 and 233, the routing electrodes 36 and 37 can be formed with accuracy not causing a trouble of electric disconnection. Accordingly, high-quality, two-layer structure-having surface-mound piezoelectric vibrators 1 can be provided in which stable electric connection between the piezoelectric vibration member 4 and the external electrodes 38 and 39 is secured.

In the above-mentioned embodiment, the cylindrical body 206 is formed of the glass frit 206*a* containing plural glass beads 206*b*; however, in place of the glass frit 206*a*, any other paste material such as a silver paste may also be used in forming the cylindrical body 206. In the case of using a paste material, the firing step is also attained for firing and hardening the material; and like that of the glass frit 206*a*, the volume of the paste material may also reduce as compared with that before firing. However, as the paste material containing glass beads 206*b* is used, the surface depressions to appear after hardening may be small and may be ignorable.

In this embodiment, the shape of the core part 207 is columnar as one illustrative example; however, it may be prismatic. Also in this case, the same advantage and effect can be exhibited.

In the above-mentioned embodiment, as the core part 207, preferably used is one having a thermal expansion coefficient substantially equal to that of the base substrate 2 (base substrate wafer 40) and the cylindrical body 206. In this case, three of the base substrate wafer 40, the cylindrical body 206 and the core part 207 thermally expand similarly in firing. Accordingly, any excessive pressure is not given to the base substrate wafer 40 and the cylindrical body 206 to crack them, owing to the difference in the thermal expansion coefficient, or there is no risk of forming a space between the cylindrical body 206 and the through-holes 230 and 231, and between the cylindrical body 206 and the core part 207. Therefore, through-electrodes of higher quality can be formed, and as a result, the quality of the piezoelectric vibrators 1 can be further increased.

(Oscillator)

Figure 27:
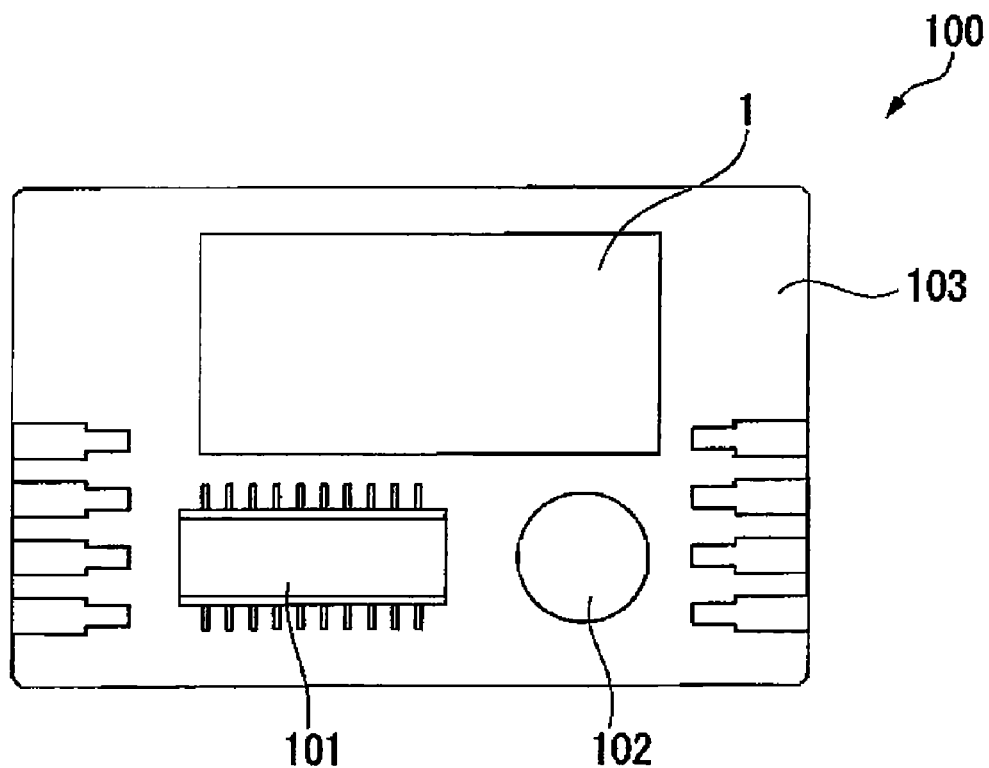
FIG. 27 is a configuration view showing one embodiment of the oscillator of the invention.

Next described is one embodiment of the oscillator of the invention, with reference to FIG. 27.

The oscillator 100 of this embodiment comprises the piezoelectric vibrator 1 electrically connected to an integrated circuit 101 to be an oscillation member therein, as shown in FIG. 27. The oscillator 100 is provided with a substrate 103 on which an electronic part 102 such as a capacitor or the like is mounted. On the substrate 103, mounted is the above-mentioned integrated circuit 101 for oscillator, and in the vicinity of the integrated circuit 101, the piezoelectric vibrator 1 is mounted thereon. These electronic part 102, integrated circuit 101 and piezoelectric vibrator 1 are electrically connected to each other with a wiring pattern (not shown). The constitutive parts each are molded with a resin (not shown).

In the thus-constituted oscillator 100, when a voltage is applied to the piezoelectric vibrator 1, then the piezoelectric vibration member 4 in the piezoelectric vibrator 1 is vibrated. The vibration is converted into an electric signal owing to the piezoelectric characteristic that the piezoelectric vibration member 4 has, and the electric signal is inputted into the integrated circuit 101. The thus-inputted electric signal is processed variously in the integrated circuit 101, and is outputted as a frequency signal. Accordingly, the piezoelectric vibrator 1 functions as an oscillation member.

In case where the integrated circuit 101 is, for example, so constituted that an RTC (real time clock) module or the like is defined therein selectively on demand, then the oscillator may act as a single-function oscillator for clocks or the like, or a function of controlling the operation date or time of the device or its external devices or providing a time, a calendar or the like may be added to the oscillator.

As described in the above, the oscillator 100 of this embodiment comprises the high-quality piezoelectric vibrator 1, in which the airtightness inside the cavity C is secured and of which the operation reliability has been improved, and therefore, the operation reliability of the oscillator 100 itself can also be enhanced and the quality thereof can be increased. In addition, the oscillator may give stable and precision frequency signals for a long period of time.

(Electronic Device)

Figure 28:
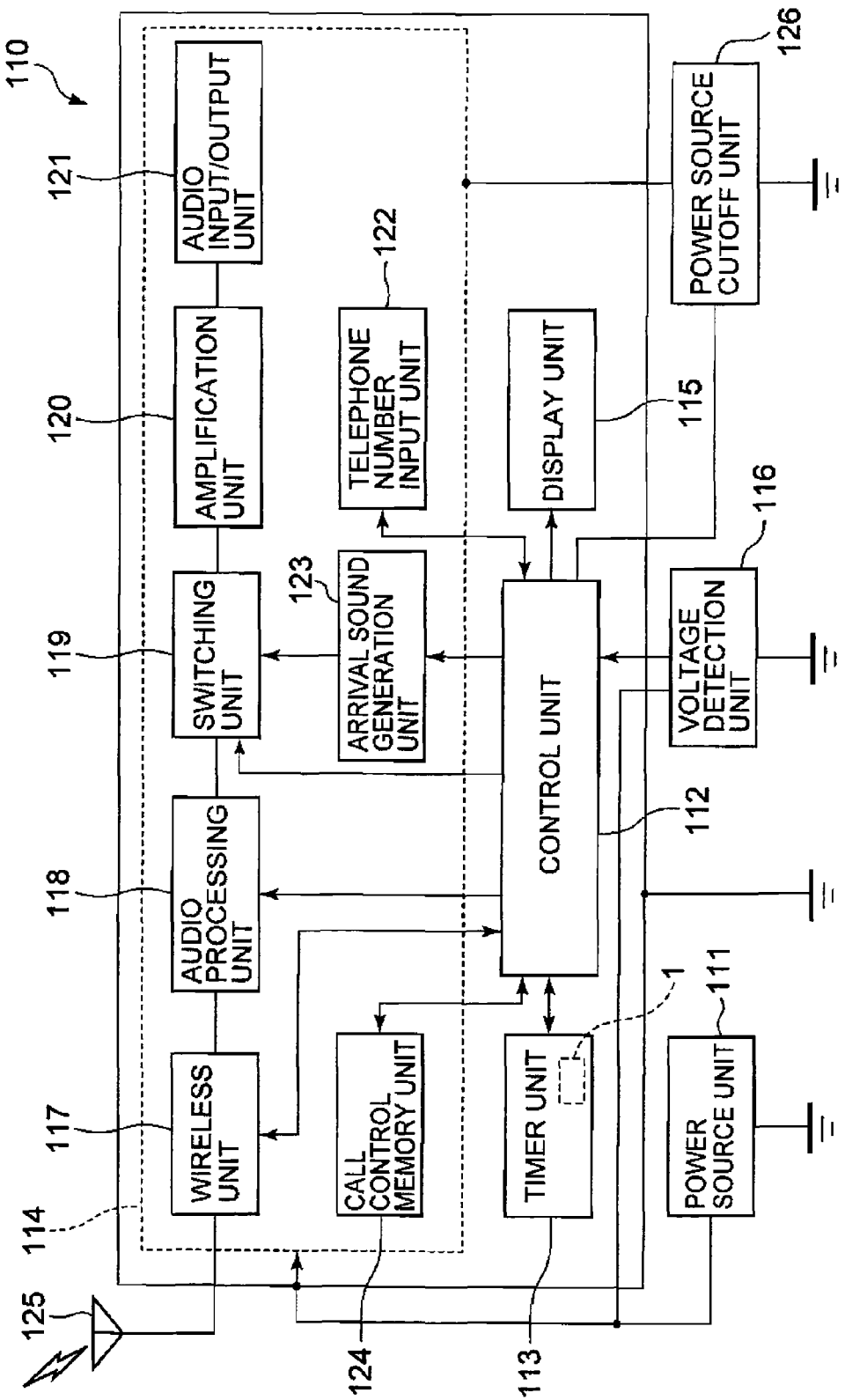
FIG. 28 is a constitutive view showing one embodiment of the electronic device of the invention.

Next described is one embodiment of the electronic device of the invention, with reference to FIG. 28. As the electronic device, a portable information device 110 having the above-mentioned piezoelectric vibrator 1 is illustrated below.

First, the portable information device 110 of this embodiment is, for example, typically a portable telephone, which is developed and improved from a prior-art wristwatch. Its appearance is similar to a wristwatch, and a liquid-crystal display is disposed in the part corresponding to the dial plate, and the current time or the like can be displayed on the panel. In case where it is utilized as a communication device, then it is taken off from the wrist, and via the speaker or the microphone built in the inside part of the band, communication can be attained like in the case of prior-art portable telephones. However, as compared with conventional portable telephones, the device of the invention is remarkably down-sized and weight-saved.

Next described is the constitution of the portable information device 110 of this embodiment. The portable information device 110 is provided with the piezoelectric vibrator 1 and a power source part 111 for power supply, as shown in FIG. 28. The power source part 111 comprises, for example, a lithium secondary battery. To the power source part 111, connected are a control part 112 for various control, a timer part 113 for counting time and the like, a communication part 114 for external communication, a display part 115 for displaying various information, and an voltage detection part 116 for detecting the voltage of the individual functional parts, all in parallel to each other. Via the power source part 111, power is supplied to the respective functional parts.

The control part 112 controls the individual functional parts, transmits and receives voice data, and counts and displays the current time, therefore controlling the operation of the entire system. The control part 112 is provided with ROM where a program is previously written, CPU for reading out the program written in ROM and executing it, and RAM to be used as a work area of CPU, etc.

The timer part 113 is provided with an integrated circuit that comprises an oscillation circuit, a register circuit, a counter circuit, an interface circuit and the like all built therein, and the piezoelectric vibrator 1. When a voltage is applied to the piezoelectric vibrator 1, then the piezoelectric vibration member 4 is vibrated and the vibration is converted into an electric signal owing to the piezoelectric characteristic that the quartz crystal has, and the electric signal is inputted into the oscillation circuit. The output from the oscillation circuit is binarized and counted by the resistor circuit and the counter circuit. Then, two-way signal transmission to the control part 112 is attained via the interface circuit, and the current time, the current date, the calendar information and the like are displayed in the display part 115.

The communication part 114 has the same function as that of a conventional portable telephone, and is provided with a wireless part 117, a voice processing part 118, a switch part 119, an amplification part 120, a voice input/output part 121, a telephone number input part 122, a ring alert generation part 123, and a call control memory part 124.

The wireless part 117 undergoes two-way transmission of various data such as voice data and the like to the base station via an antenna 125. The voice processing part 118 codes and decodes the voice signal inputted from the wireless part 117 or the amplification part 120. The amplification part 120 amplifies the signal inputted from the voice processing part 118 or the voice input/output part 121 up to a predetermined level. The voice input/output part 121 comprises a speaker, a microphone or the like, and this amplifies the ring alert or the received voice, or collects the voice.

The ring alert generation part 123 generates a ring alert in accordance with the call from the base station. The switch part 119 turns the amplification part 120 connected to the sound processing part 118 to the ring alert generation part 123 only in calling whereby the ring alert generated in the ring alert generation part 123 is outputted to the voice input/output part 121 via the amplification part 120.

The call control memory part 124 houses a program relating to communication incoming/outgoing call control. The telephone number input part 122 is provided with number keys of, for example, from 0 to 9 and other keys, and by pushing these number keys and others, the calling telephone number or the like is inputted.

The voltage detection part 116 detects the voltage depression and notifies it to the control part 112, when the voltage applied to the various functional parts such as the control part 112 and others from the power source part 111 has fallen below the predetermined level. The predetermined voltage is a value previously set as the minimum voltage necessary for stable operation of the communication part 114, and is, for example, around 3 V. The control part 112 that has received the notice of voltage depression from the voltage detection part 116 inhibits the operation of the wireless part 117, the voice processing part 118, the switch part 119 and the ring alert generation part 123. In particular, the operation stopping of the wireless part 117 that consumes much power is indispensable. Further, the display part 115 displays the unavailability of the communication part 114 owing to the shortage of the battery residue.

Specifically, the voltage detection part 116 and the control part 112 inhibit the operation of the communication part 114, which may be displayed on the display part 115. The display may be a letter message, or for more intuitive expression, a mark (x) (unavailability mark) may be given to the telephone icon to be displayed in the upper part of the display panel of the display part 115.

A power shutdown part 126 capable of selectively shutting down the power relating to the function of the communication part 114 may be provided whereby the function of the communication part 114 may be more surely stopped.

As described in the above, the portable information device 110 of this embodiment comprises the high-quality piezoelectric vibrator 1, in which the airtightness inside the cavity C is secured and of which the operation reliability has been improved, and therefore, the operation reliability of the portable information device itself can also be enhanced and the quality thereof can be increased. In addition, the device can exhibit stable and precision time information for a long period of time.

(Radio-Controlled Watch)

Figure 29:
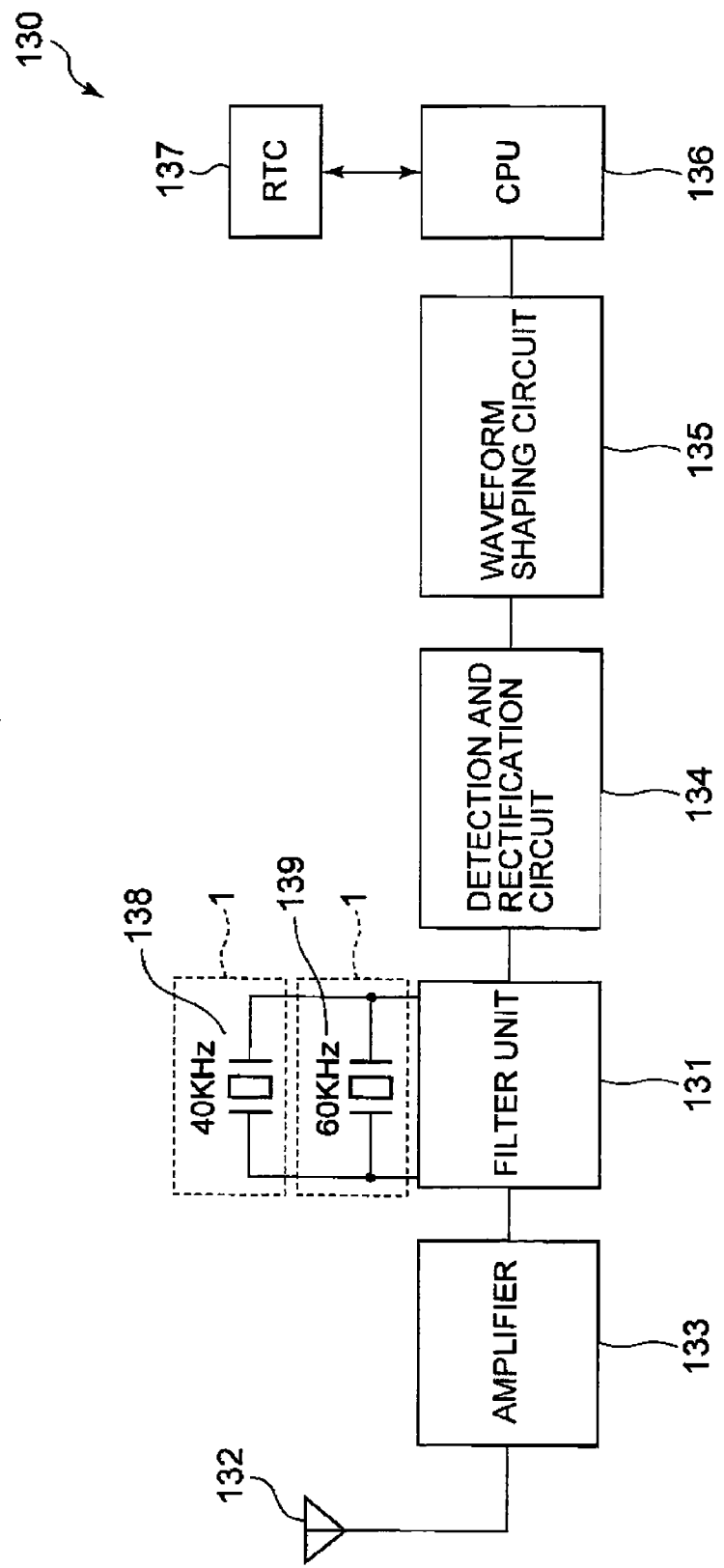
FIG. 29 is a constitutive view showing one embodiment of the radio-controlled watch of the invention.
Figure 30:
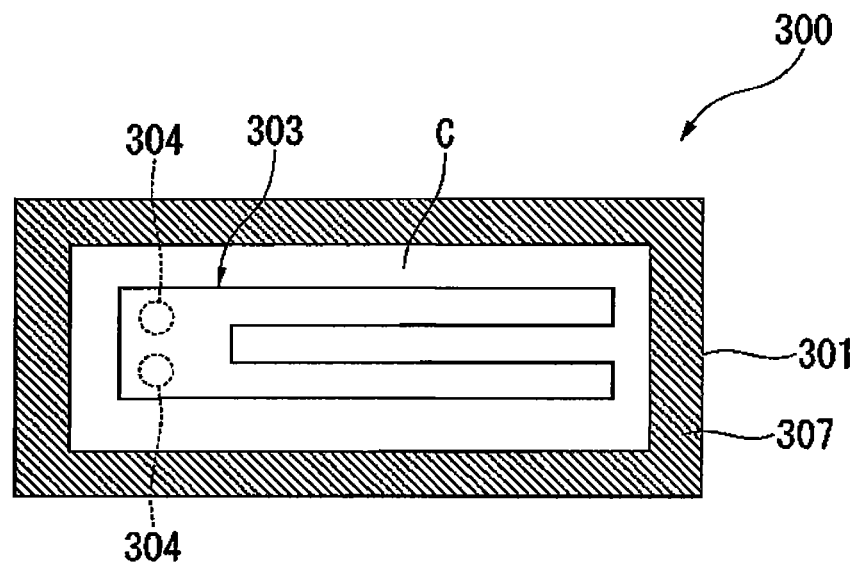
FIG. 30 is an internal configuration view of a conventional piezoelectric vibrator, and is a top view of the piezoelectric vibration member thereof from which the lid substrate was removed.
Figure 31:
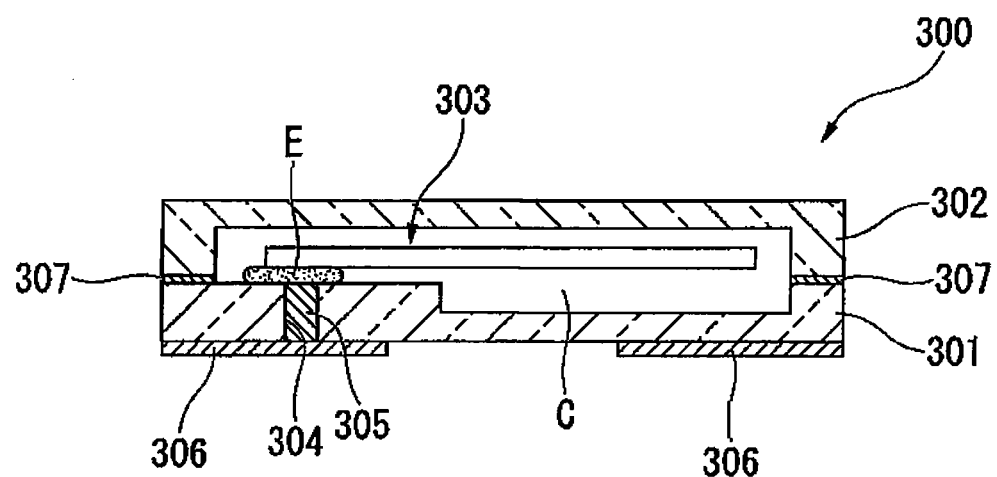
FIG. 31 is a cross-sectional view of the piezoelectric vibrator shown in FIG. 30.

Next described is one embodiment of the radio-controlled watch of the invention, with reference to FIG. 29.

The radio-controlled watch 130 of this embodiment comprises the piezoelectric vibrator 1 electrically connected to a filter part 131, as shown in FIG. 29, and this is a watch having the function of receiving the standard waves that include time information, automatically correcting it to a correct time and displaying the time.

In Japan, there are transmitter stations for transmitting the standard waves in Fukushima prefecture (40 kHz) and Saga prefecture (60 kHz), and they transmit the standard waves. The long wave of 40 kHz or 60 kHz has both the property of passing on the land surface and the property of reflecting on the ionosphere and the land surface and passing thereon; and therefore, its passing region is broad, and the above-mentioned two transmitter stations cover everywhere in Japan.

The details of the functional constitution of the radio-controlled watch 130 are described below.

The antenna 132 receives the long standard wave of 40 kHz or 60 kHz. For the long standard wave, a carrier wave of 40 kHz or 60 kHz is processed for AM modulation with a time information referred to as a time code. The received long standard wave is amplified by the amplifier 133, and filtered and synchronized by the filter part 131 having a plurality of piezoelectric vibrators 1.

The piezoelectric vibrators 1 in this embodiment each are provided with a quartz crystal vibration member 138 or 139 having the same resonance frequency of 40 kHz or 60 kHz as the above-mentioned carrier frequency.

Further, the filtered signal having a predetermined frequency is detected and demodulated by the detection/rectification circuit 134.

Subsequently, via the waveform shaper circuit 135, the time code is taken out, and counted in CPU 136. In CPU 136, information such as the current year, the accumulated date, the week day, the time and the like are read out. The read-out information is reflected by RTC 137, and the accurate time information is thereby displayed.

The carrier wave is 40 kHz or 60 kHz, and therefore, the quartz crystal vibration members 138 and 139 are preferably the above-mentioned, tuning fork-like vibrators.

The above explanation is for an example in Japan; however, the frequency of the long standard wave differs in foreign countries. For example, in Germany, a standard wave of 77.5 kHz is employed. Accordingly, in case where a radio-controlled watch 130 applicable to foreign use is built in a portable device, it further requires the piezoelectric vibrator 1 of which the frequency differs from that in Japan.

As described in the above, the radio-controlled watch 130 of this embodiment comprises the high-quality piezoelectric vibrator 1, in which the airtightness inside the cavity C is secured and of which the operation reliability has been improved, and therefore, the operation reliability of the radio-controlled watch itself can also be enhanced and the quality thereof can be increased. In addition, the watch can count time stably with accuracy for a long period of time.

The technical scope of the invention is not limited to the above-mentioned embodiments, and various changes may be given thereto not overstepping the scope and the spirit of the invention.

For example, in the above-mentioned embodiments, the through-holes are shaped to have a conical form with a tapered cross section; however, how having a tapered cross section, they may have a straight columnar shape.

In the above-mentioned embodiments, an example of a grooved piezoelectric vibration member 4 having a groove 18 formed in both faces of the vibration arms 10 and 11 is illustrated as one example of the piezoelectric vibration member 4; however, a piezoelectric vibration member not having the groove 18 may also be employed herein. However, forming the groove 18 may increase the field effect efficiency between a pair of excitation electrodes 15 when a predetermined voltage is applied to the pair of excitation electrodes 15, and therefore the vibration loss may be reduced and the vibration characteristics may be further enhanced. In other words, the CI value (crystal impedance) may be further reduced, and the performance of the piezoelectric vibration member 4 can be further enhanced. In this respect, forming the groove 18 is preferred.

In the above-mentioned embodiments, an example of a tuning folk-type piezoelectric vibration member 4 is illustrated; however, the vibration member is not limited to the tuning folk-type one. For example, it may be a thickness-shear vibration member.

In the above-mentioned embodiments, the base substrate 2 and the lid substrate 3 are anodically bonded via a bonding film 35; but the bonding mode is not limited to anodic bonding. However, anodic bonding is preferred as capable of firmly bonding the two substrates 2 and 3.

In the above-mentioned embodiments, the piezoelectric vibration member 4 is bump-bonded, but the bonding mode is not limited to bump-bonding. For example, the piezoelectric vibration member 4 may be bonded with an electroconductive adhesive. However, bump-bonding makes it possible to space the piezoelectric vibration member 4 from the upper face of the base substrate 2, and naturally ensures the minimum vibration gap necessary for vibration. Accordingly, bump-bonding is preferred.

In the above-mentioned embodiments, the thermal expansion coefficient of the glass beads is substantially equal to that of the base substrate wafer 40, to which, however, the invention is not limited. However, when the thermal expansion coefficient of the glass beads is substantially equal to that of the wafer 40, then cracking may be inhibited, and the quality of the devices can be increased. Therefore, preferably, the thermal expansion coefficient of the two is substantially equal to each other.

The piezoelectric vibrator of the invention is applicable to a surface mount device-type (SMD) piezoelectric vibrator in which the piezoelectric vibration member is sealed up in the cavity formed between the bonded two substrates.

The invention claimed is:

1. A piezoelectric vibrator comprising:
a base substrate,
a lid substrate in which cavity recesses are formed and which is bonded to the base substrate in such a state that the recesses face the base substrate,
a piezoelectric vibration member bonded to the upper face of the base substrate in such a state that it is housed in the cavity formed of the recess between the base substrate and the lid substrate,
an external electrode formed on the lower face of the base substrate,
a through-electrode formed in the through-electrode formed in the base substrate in such a state that it is electrically connected with the external electrode with keeping the airtightness inside the cavity, and
a routing electrode formed on the upper face of the base substrate to electrically connect the piezoelectric vibration member and the through-electrode;
wherein the through-electrode is composed of:
an electroconductive core part inserted into the through-hole, and
a cylindrical body formed by mixing a glass frit and a granular material having a higher hardness than that of the glass frit followed by filling the mixture into the space between the through-hole and the core part.

2. A piezoelectric vibrator comprising:
a base substrate,
a lid substrate in which cavity recesses are formed and which is bonded to the base substrate in such a state that the recesses face the base substrate,
a piezoelectric vibration member bonded to the upper face of the base substrate in such a state that it is housed in the cavity formed of the recess between the base substrate and the lid substrate,
an external electrode formed on the lower face of the base substrate,
a through-electrode formed in the through-electrode formed in the base substrate in such a state that it is electrically connected with the external electrode with keeping the airtightness inside the cavity, and
a routing electrode formed on the upper face of the base substrate to electrically connect the piezoelectric vibration member and the through-electrode;
wherein the through-electrode is composed of:
an electroconductive core part inserted into the through-hole, and
a cylindrical body formed by mixing a paste material and a granular material having a higher hardness than that of the paste material followed by filling the mixture into the space between the through-hole and the core part.

3. The piezoelectric vibrator as claimed in claim 1, wherein the granular material is glass beads.

4. The piezoelectric vibrator as claimed in claim 1, wherein the hardness of the cylindrical body is substantially equal to the hardness of the base substrate.

* * * * *